US009318882B2

(12) United States Patent
Yoshida et al.

(10) Patent No.: US 9,318,882 B2
(45) Date of Patent: Apr. 19, 2016

(54) INVERTER DEVICE

(71) Applicant: FUJI ELECTRIC CO., LTD., Kawasaki-shi (JP)

(72) Inventors: Toshihiro Yoshida, Suzuka (JP); Tomokazu Yoshikawa, Yokkaichi (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 100 days.

(21) Appl. No.: 14/131,780

(22) PCT Filed: Oct. 26, 2012

(86) PCT No.: PCT/JP2012/077771
§ 371 (c)(1),
(2) Date: Jan. 9, 2014

(87) PCT Pub. No.: WO2013/065610
PCT Pub. Date: May 10, 2013

(65) Prior Publication Data
US 2014/0192455 A1   Jul. 10, 2014

(30) Foreign Application Priority Data

Oct. 31, 2011   (JP) .................... 2011-239734

(51) Int. Cl.
*H02B 1/20* (2006.01)
*H02B 1/01* (2006.01)
*H05K 7/14* (2006.01)
*H02M 7/00* (2006.01)

(52) U.S. Cl.
CPC ............... *H02B 1/012* (2013.01); *H02M 7/003* (2013.01); *H05K 7/1432* (2013.01)

(58) Field of Classification Search
None
See application file for complete search history.

(56) References Cited

U.S. PATENT DOCUMENTS

| | | | | |
|---|---|---|---|---|
| 4,772,999 A * | 9/1988 | Fiorina et al. | ................ | 363/141 |
| 7,724,503 B2 | 5/2010 | Talja | | |
| 8,223,476 B2 * | 7/2012 | Zhang et al. | ................ | 361/671 |
| 8,659,881 B2 * | 2/2014 | Tsai et al. | ................ | 361/637 |
| 8,908,354 B2 * | 12/2014 | Bald et al. | ................ | 361/621 |
| 9,042,112 B2 * | 5/2015 | Guan et al. | ................ | 361/763 |
| 2006/0092611 A1 * | 5/2006 | Beihoff et al. | ................ | 361/698 |
| 2009/0015190 A1 | 1/2009 | Siemes | | |

(Continued)

FOREIGN PATENT DOCUMENTS

| | | |
|---|---|---|
| CN | 101110548 A | 1/2008 |
| JP | S61-096594 U | 6/1986 |

(Continued)

OTHER PUBLICATIONS

Europe Patent Office, "Search Report for EP 12846729.7," Jul. 14, 2015.

(Continued)

*Primary Examiner* — Courtney Smith
(74) *Attorney, Agent, or Firm* — Manabu Kanesaka

(57) ABSTRACT

An inverter device has an inverter stack and a switchboard housing the inverter stack. The inverter stack has an output relay bar connected to an output terminal thereof, and a lower frame configuring a bottom portion and formed from a plurality of frame members connected to form each side of a cuboid. The lower frame is formed such that the frame members configuring one side of a four-sided frame being penetrated by the output relay bar are formed of a non-magnetic body.

7 Claims, 29 Drawing Sheets

(56) References Cited

U.S. PATENT DOCUMENTS

2011/0194249 A1    8/2011  Nakasaka et al.
2011/0261506 A1*  10/2011  Narin et al. ............... 361/611
2012/0087051 A1*   4/2012  Spitaels et al. ............ 361/63
2014/0160686 A1*   6/2014  Benson et al. ............. 361/724

FOREIGN PATENT DOCUMENTS

| JP | H05-078196 U  | 10/1993 |
| JP | H07-123539 A  | 5/1995  |
| JP | 2002-271921 A | 9/2002  |
| JP | 2010-035295 A | 2/2010  |
| JP | 2010-114971 A | 5/2010  |

OTHER PUBLICATIONS

PCT, "International Search Report for International Application No. PCT/JP2012/077771".

China Patent Office, "Office Action for CN 201280032702.7," Jul. 31, 2015.

* cited by examiner

INVERTER DEVICE

RELATED APPLICATIONS

The present application is National Phase of International Application No. PCT/JP2012/077771 filed Oct. 26, 2012, and claims priority from Japanese Application No. 2011-239734 filed Oct. 31, 2011.

TECHNICAL FIELD

The present invention relates to an inverter device, and more specifically, relates to an inverter device including an inverter stack having casters on a bottom portion thereof and a switchboard in which the inverter stack is housed by being entered from the front.

BACKGROUND ART

A heretofore known inverter device includes an inverter stack having casters on a bottom portion thereof and a switchboard in which the inverter stack is housed by being entered from the front (for example, refer to Patent Literature 1).

CITATION LIST

Patent Literature

Patent Literature 1: JP-A-H07-123539

SUMMARY OF INVENTION

Technical Problem

Although not clearly indicated in Patent Literature 1, the heretofore known inverter device is configured such that an output terminal of the inverter stack and an output relay terminal forming a switchboard, and to which an output wire connected to a load is attached, are linked by a plate-shaped output relay bar. Further, the inverter stack configuring the inverter device is formed such that a lower frame that configures a bottom portion, and which is passed through the output relay bar, is formed of stainless steel or the like, which is a non-magnetic body, with a view to prevent heating and vibration due to the occurrence of an overcurrent, or the like. The stainless steel is expensive compared to a steel plate or the like, which leads to an increase in the manufacturing cost of an inverter device that includes an inverter stack having this kind of lower frame.

The invention, bearing in mind the heretofore described situation, has an object of providing an inverter device such that it is possible to achieve a reduction in manufacturing cost while preventing heating and vibration due to the occurrence of an overcurrent, or the like.

Solution to Problem

In order to achieve the object, an inverter device according to the first aspect of the invention relates to an inverter device including an inverter stack and a switchboard that houses the inverter stack. The inverter stack has an output relay bar linked to its own output terminal, and a lower frame configuring a bottom portion and formed of a plurality of frame members linked so as to form the sides of a cuboid. The lower frame is formed such that frame members configuring one side of a four-sided frame through which the output relay bar passes are formed of a non-magnetic body.

Advantageous Effects of Invention

According to the invention, the inverter stack has an output relay bar linked to its own output terminal, and a lower frame configuring a bottom portion and formed of a plurality of frame members linked so as to form the sides of a cuboid, and the lower frame is formed such that frame members configuring one side of a four-sided frame through which the output relay bar passes are formed of a non-magnetic body, because of which it is possible to control the occurrence of an overcurrent, and thus possible to prevent heating and vibration due to the occurrence of an overcurrent, or the like. Also, as it is possible to configure the other frame members of the lower frame of sheet-metal or the like, it is possible to reduce manufacturing cost in comparison with when forming all the frame members of a non-magnetic body such as stainless steel. Consequently, an advantage is achieved in that it is possible to achieve a reduction in manufacturing cost while preventing heating and vibration due to the occurrence of an overcurrent, or the like.

BRIEF DESCRIPTION OF DRAWINGS

FIG. 2 is viewed from a front side.

FIG. 2 is viewed from a rear side.

FIG. 42 is applied.

DESCRIPTION OF THE EMBODIMENTS

Hereafter, referring to the attached drawings, a detailed description will be given of a preferred embodiment of an inverter device according to the invention.

Figure 1:
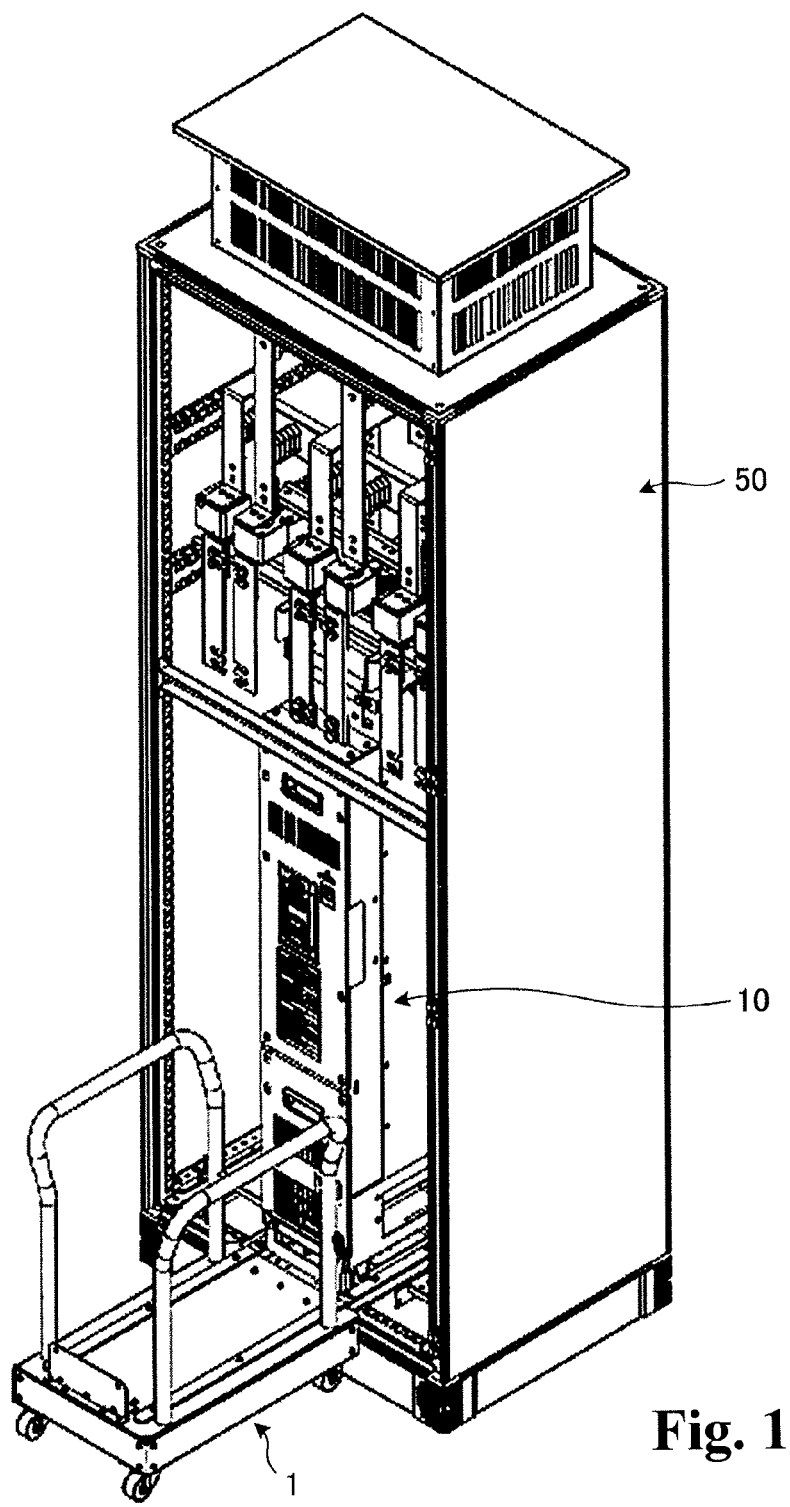
FIG. 1 is a perspective view showing an inverter device which is an embodiment of the invention.

FIG. 1 is a perspective view showing an inverter device which is an embodiment of the invention. The inverter device illustrated here is configured to include an inverter stack 10 and a switchboard 50. The inverter stack 10 includes an inverter circuit in the interior thereof, is transported by a transport cart 1, as shown in FIG. 2, and installed in the target switchboard 50.

Figure 2:
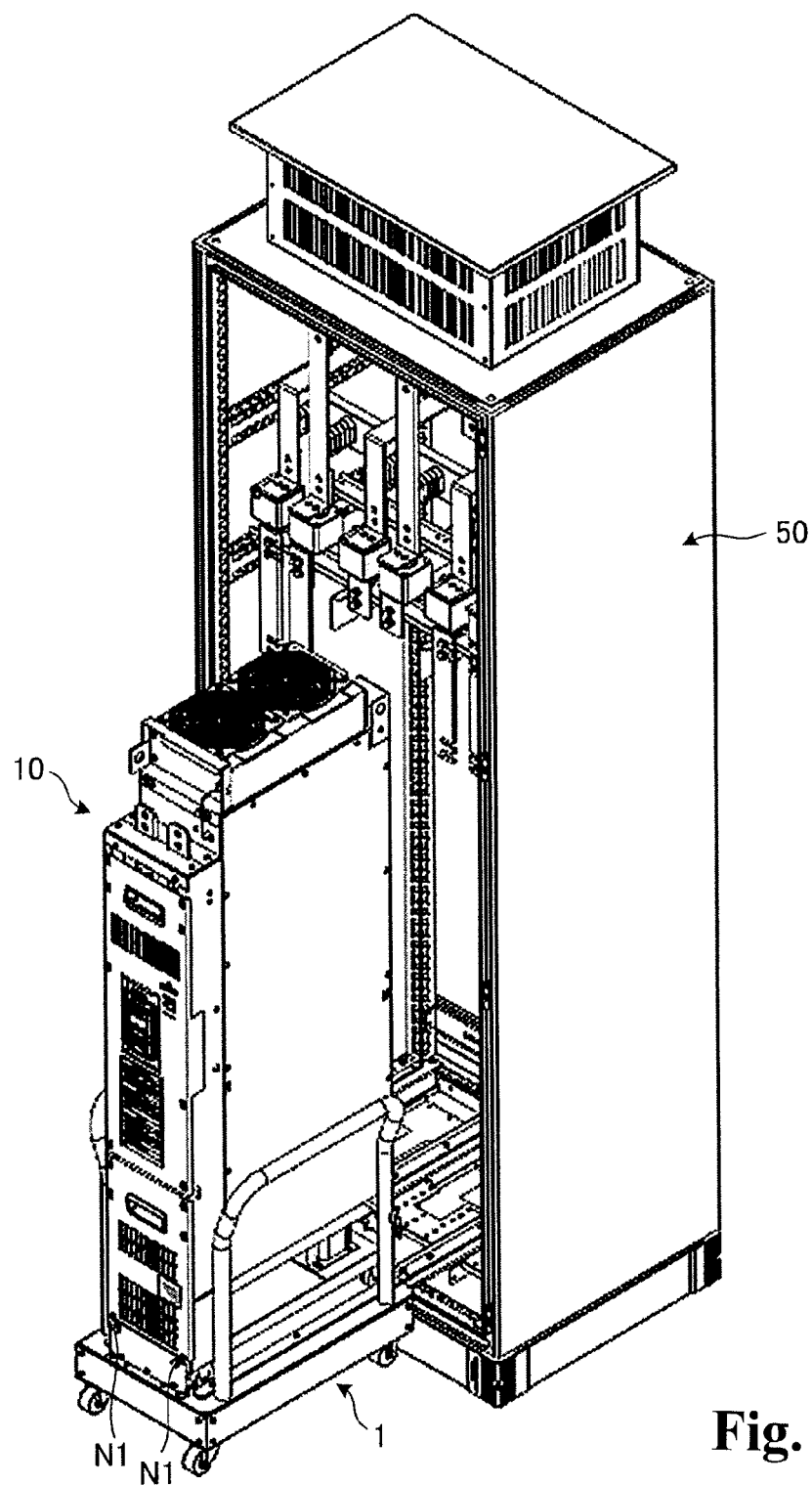
FIG. 2 is a perspective view showing a state in which an inverter stack configuring the inverter device shown in FIG. 1 is conveyed by a transport cart.
Figure 3:
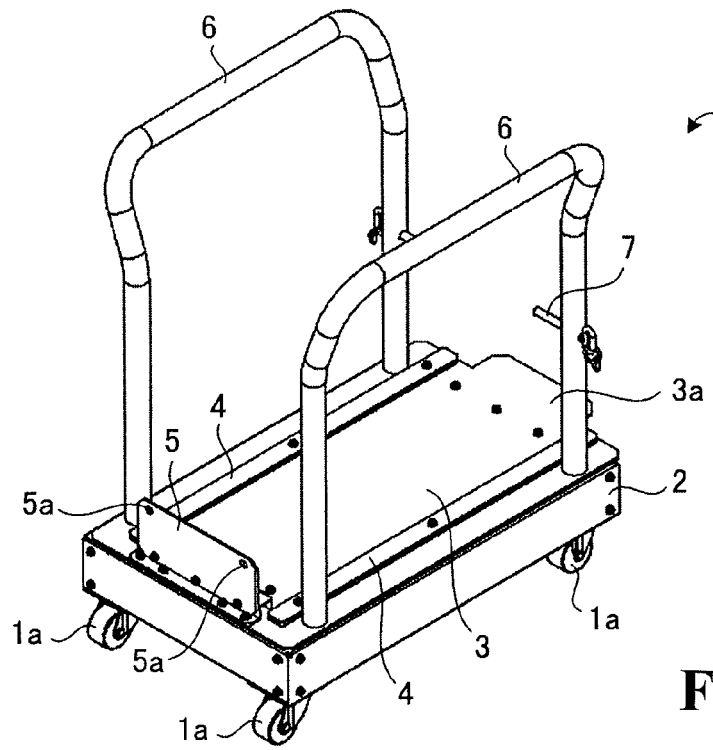
FIG. 3 is a perspective view showing a state in which the transport cart applied to the inverter device shown in FIG. 1
Figure 4:
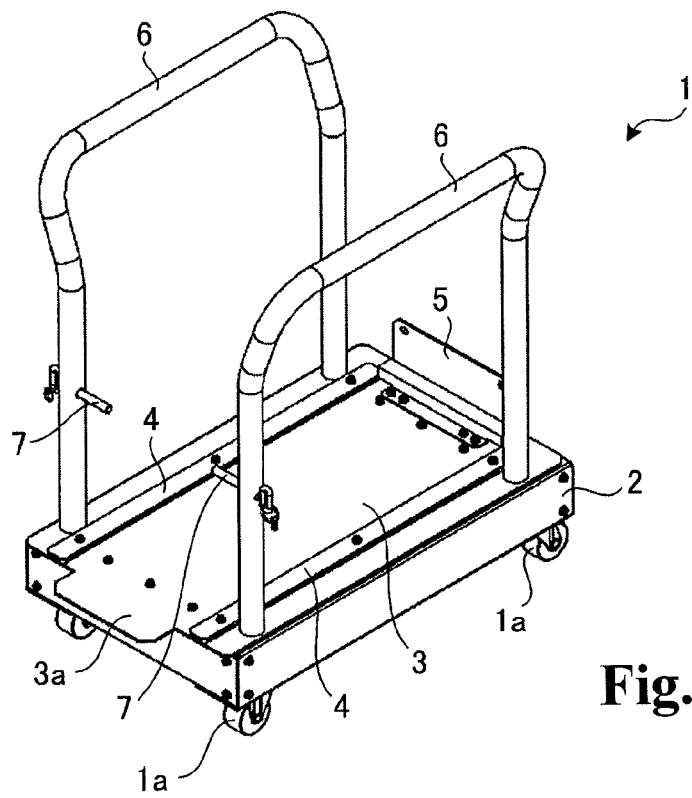
FIG. 4 is a perspective view showing a state in which the transport cart applied to the inverter device shown in FIG. 1

FIG. 3 and FIG. 4 each show the transport cart 1 applied to the inverter device shown in FIG. 1 and FIG. 2, wherein FIG. 3 is a perspective view showing a state in which the transport cart 1 is viewed from the front, while FIG. 4 is a perspective view showing a state in which the transport cart 1 is viewed from a rear side.

As shown in FIG. 3 and FIG. 4, the transport cart 1 is configured of a support surface 3, rail guides (guide members) 4, a fixing plate (fixing and supporting member) 5, and gripping portions 6 provided on a base 2 including a plurality of (for example, four) cart casters 1a.

Figure 5:
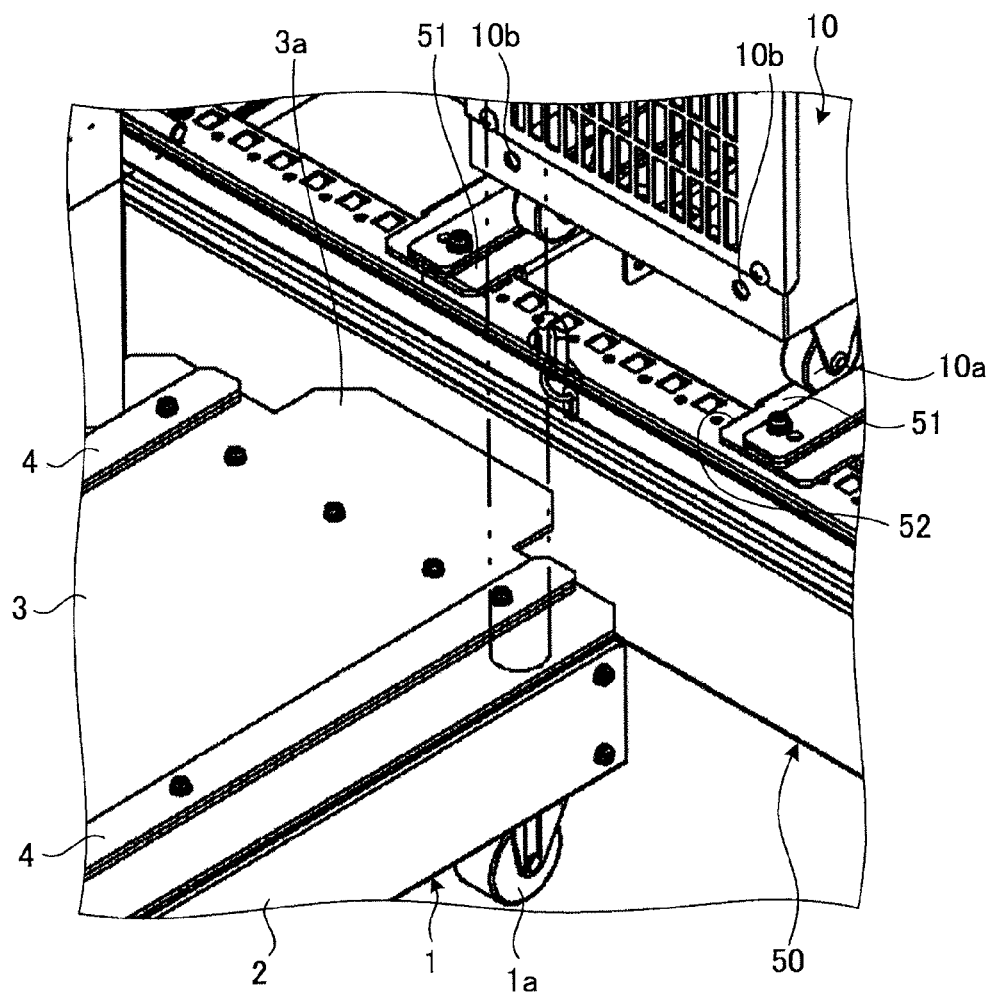
FIG. 5 is a perspective view showing an enlargement of a condition in which the transport cart is in close proximity of a switchboard.

The support surface 3 is configured of a steel plate, or the like, on the upper surface of the base 2, and is a surface on which casters 10a provided on a bottom portion of the inverter stack 10 can roll. The support surface 3 supports the inverter stack 10 in a condition in which the inverter stack 10 is mounted. As shown in FIG. 5, the support surface 3 has a height level the same as that of two mounting surfaces 51 of the inverter stack 10 in the switchboard 50, that is, surfaces on which the casters 10a of the inverter stack 10 can roll.

A protruding portion 3a is provided on this kind of support surface 3. The protruding portion 3a is a plate-shaped portion formed so as to protrude backward from a rear edge portion of the support surface 3. The size of the left-to-right width of the protruding portion 3a corresponds to the distance between the two mounting surfaces 51 in the switchboard 50, and when bringing the transport cart 1 into proximity from the front, positioning in a horizontal direction is carried out by the protruding portion 3a entering an entrance portion 52 of the switchboard 50 formed between the mounting surfaces 51, as shown in FIG. 5.

The rail guides 4 are elongated plate-shaped bodies extending in a longitudinal direction on both left and right ends of the support surface 3. The rail guides 4 are fixed to the support surface 3 with screws, or the like. The rail guides 4 of this kind guide the rolling of the casters 10a of the inverter stack 10 when the inverter stack 10 supported in a mounted condition by the support surface 3 is moved toward the switchboard 50, and restrict deviation in a horizontal direction of the inverter stack 10.

The fixing plate 5 is a plate-shaped body provided so as to stand upright from the base 2 on the front side of the support surface 3. A plurality of (for example, two) screw holes 5a is formed in the fixing plate 5. When the inverter stack 10 is supported in a mounted condition by the support surface 3, the screw holes 5a are provided corresponding one each to screw holes 10b formed in a lower front surface of the inverter stack 10. Because of this, when the inverter stack 10 is supported by the support surface 3, screws N1 are inserted from the front through both the screw holes 5a of the fixing plate 5 and the screw holes 10b of the inverter stack 10, and the fixing plate 5 is fastened to the inverter stack 10 by tightening the screws N1 by rotating them around the axes thereof.

That is, the fixing plate 5 fixes and supports the inverter stack 10 by being fastened to the inverter stack 10 supported by the support surface 3 via fastening members such as the screws N1.

The gripping portions 6 are formed so as to form a left-right pair on the base 2. The gripping portions 6 are configured by appropriately bending pipes, which are elongated rod-shaped bodies, and connecting both ends of each pipe to the base 2 by welding or the like, and are gripped by the user, that is, the conveyor of the inverter stack 10. References 7 in FIG. 3 and FIG. 4 are stoppers, and are provided on the gripping portions 6.

The inverter stack 10 mounted on and supported by the support surface 3 of this kind of transport cart 1 is conveyed to the front of the switchboard 50 in which the inverter stack 10 is to be installed, as shown in FIG. 2, and positioning is subsequently carried out by the transport cart 1 being brought into proximity with the switchboard 50, and the protruding portion 3a being entered into the predetermined entrance portion 52 of the switchboard 50. Then, the screws N1 inserted through the screw holes 5b and 10b of the fixing plate 5 and inverter stack 10 are removed, thus releasing the fastening of the fixing plate 5 and inverter stack 10, and the inverter stack 10 can be housed in the switchboard 50 as shown in FIG. 1 by the inverter stack 10 being moved and entered from the front of the switchboard 50.

Figure 6:
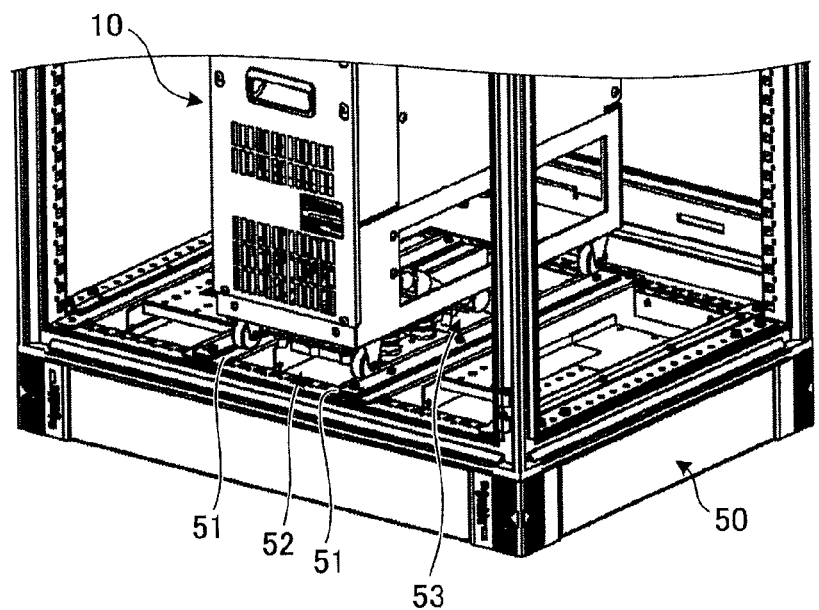
FIG. 6 is a perspective view showing a housing bottom portion of the switchboard shown in FIG. 1 and FIG. 2 in which the inverter stack is housed.
Figure 7:
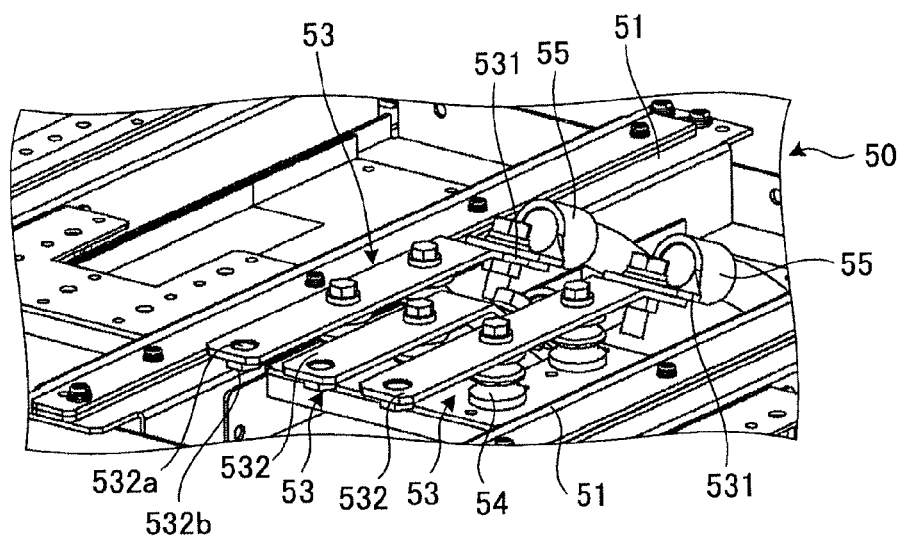
FIG. 7 is a perspective view showing an enlargement of a main portion of the housing bottom portion shown in FIG. 6.
Figure 8:
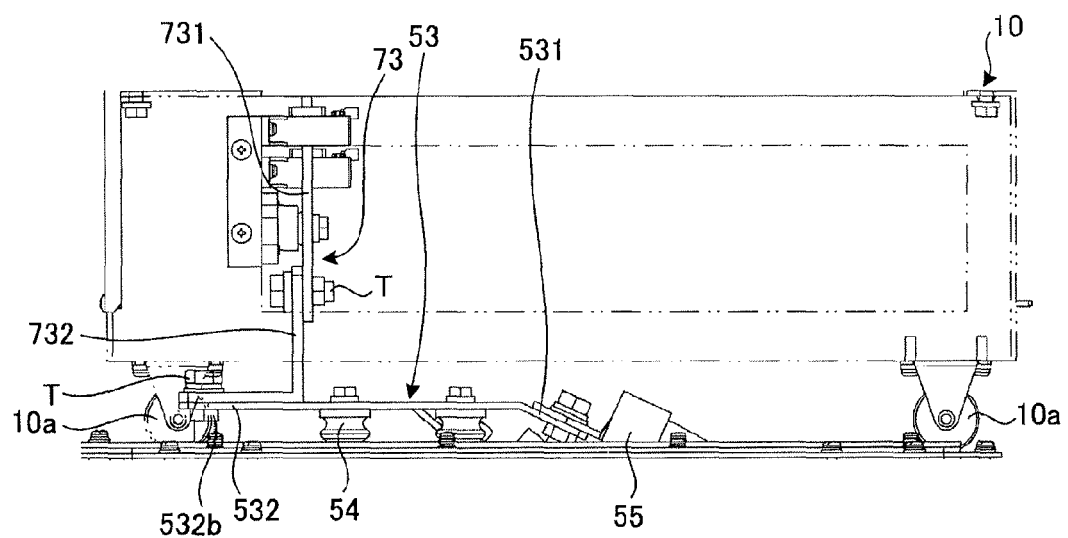
FIG. 8 is an illustration showing a state in which the housing bottom portion of the switchboard shown in FIG. 6 is viewed from the side.

FIG. 6 is a perspective view showing a housing bottom portion of the switchboard 50 shown in FIG. 1 and FIG. 2 in which the inverter stack 10 is housed, FIG. 7 is a perspective view showing an enlargement of a main portion of the housing bottom portion shown in FIG. 6, and FIG. 8 is an illustration showing a state in which the housing bottom portion of the switchboard 50 shown in FIG. 6 is viewed from the side. As shown in FIG. 6 to FIG. 8, the switchboard 50 includes an output relay terminal 53.

A plurality (for example, three) of the output relay terminal 53 being provided, a U-phase output relay terminal 53, a V-phase output relay terminal 53, and a W-phase output relay terminal 53 are provided extending in the inverter stack 10 entry direction, that is, the longitudinal direction, and are provided in the housing bottom portion of the switchboard 50 so as to be aligned in parallel across insulators 54. A rear surface end portion 531 of each of the output relay terminals 53 bends downward, and an output wire 55 connected to a load such as, for example, a motor, is attached to each rear surface end portion 531. Also, a through hole 532a is formed in a front surface end portion 532 of each of the output relay terminals 53, and a nut 532b is fixed and supported on the lower surface corresponding to the relevant through hole 532a.

The output relay terminals 53 are positioned lower than a bottom portion of the inverter stack 10 to be housed, or more specifically, She output relay terminals 53 are in a position at a height level lower than that of the casters 10a of the inverter stack 10.

Figure 9:
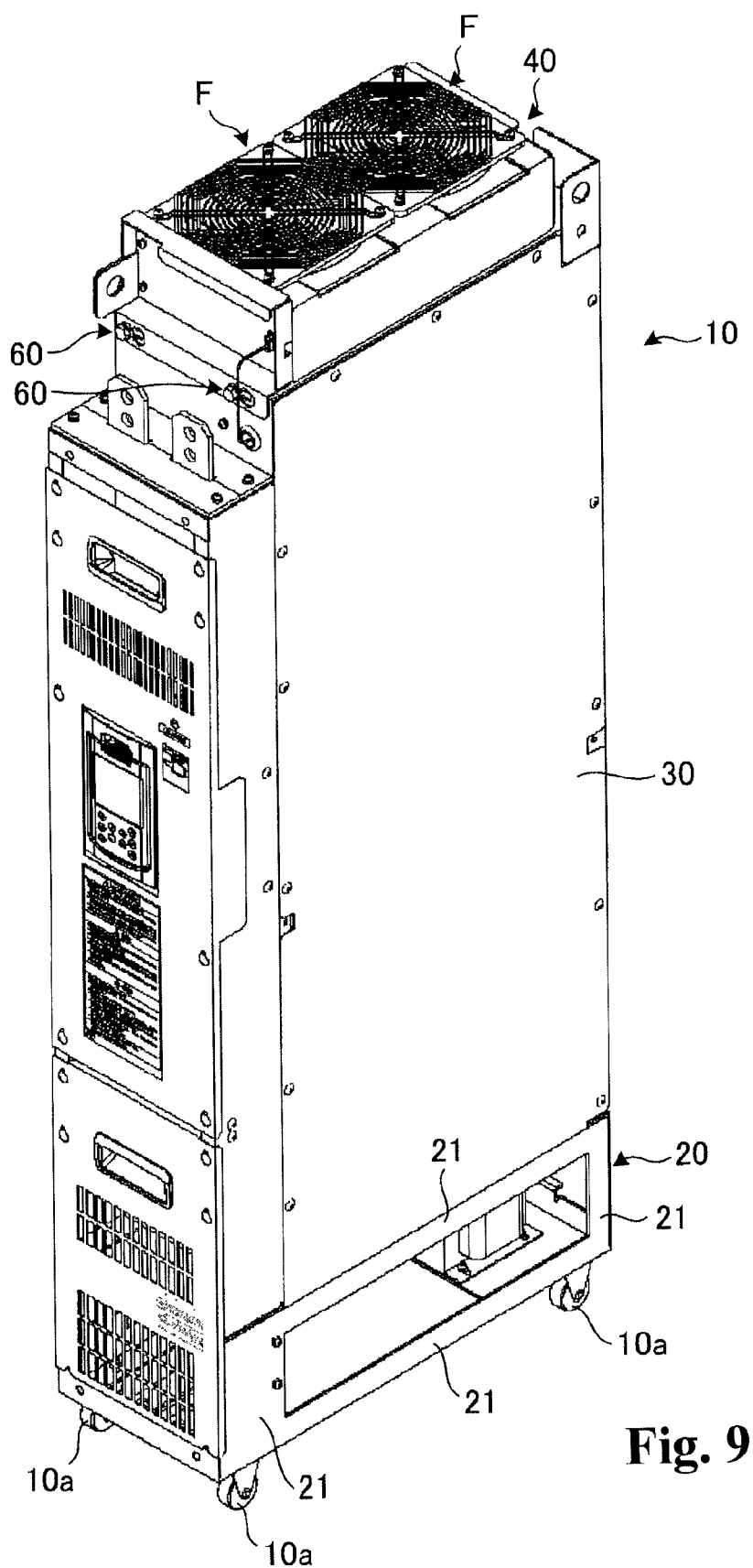
FIG. 9 is a perspective view showing the inverter stack configuring the inverter device shown in FIG. 1 and FIG. 2.

FIG. 9 is a perspective view showing the inverter stack 10 configuring the inverter device shown in FIG. 1 and FIG. 2. The inverter stack 10 is configured to include a lower frame 20, an inverter main body 30, and a fan block 40. The lower frame 20 configures the bottom portion of the inverter stack 10, and has the heretofore described casters 10a. Although a detailed description will be given hereafter, the lower frame 20 is formed of a plurality of frame members 21 linked by screwing, or the like, so as to form the sides of a cuboid.

Figure 10:
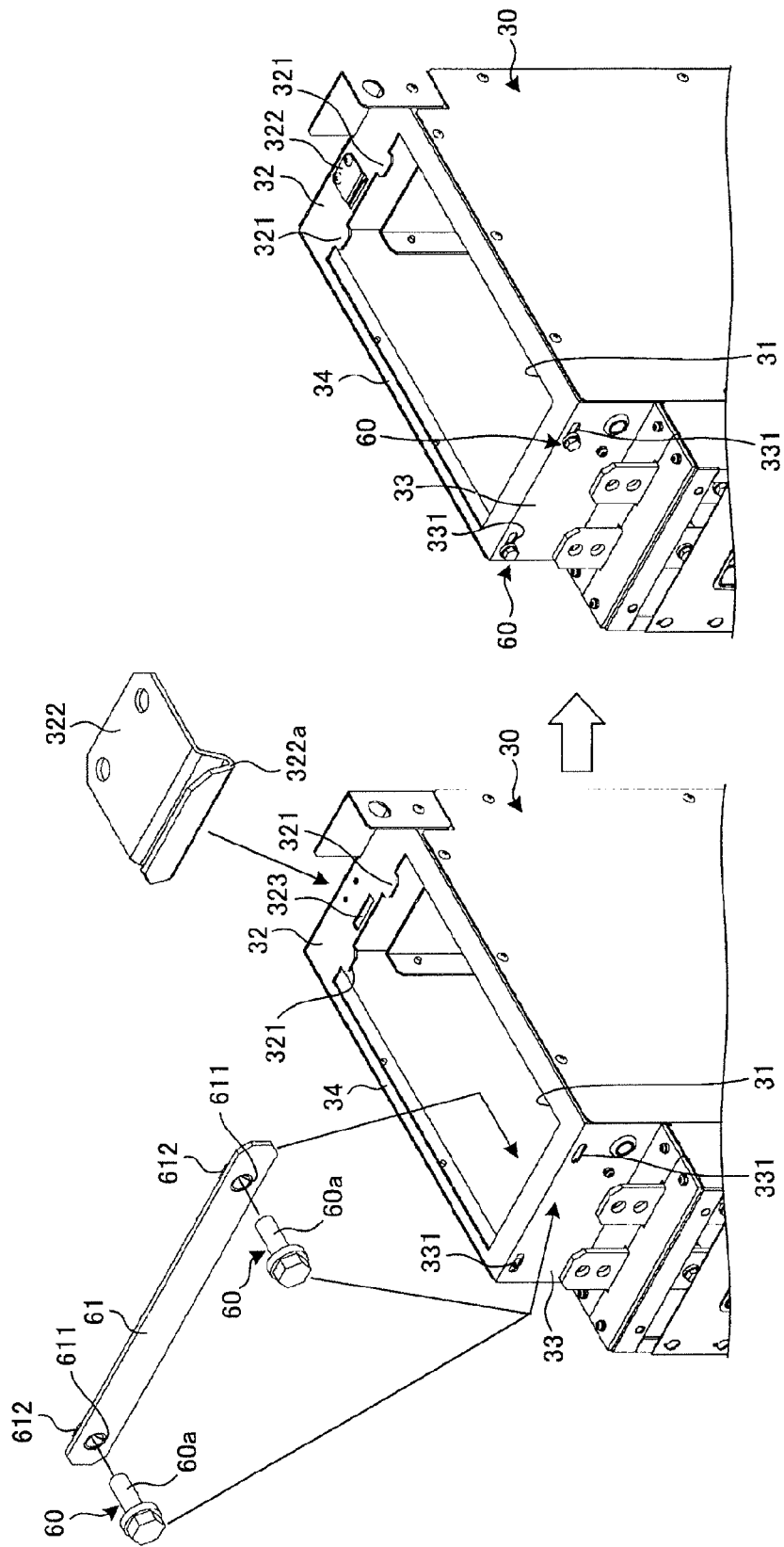
FIG. 10 is an illustration showing the configuration of the upper surface of an inverter main body.

The inverter main body 30 is a housing incorporating in the interior thereof various circuits, such as an inverter circuit. An aperture 31 is formed in the upper surface of the inverter main body 30, as shown in FIG. 10. Two protruding pieces 321 protruding frontward are formed on a rear edge portion 32 of the upper surface of the inverter main body 30 in which this kind of aperture 31 is formed. Also, a plate spring member 322 is fixed by fastening with screws, or the like, to the rear edge portion 32. A leading end portion 322a of the plate spring member 322 is of a form bent downward, and the leading end portion 322a enters a rectangular through hole 323 formed in the rear edge portion 32 from above.

Also, the inverter main body 30 is formed such that two slots 331 whose horizontal direction is the longitudinal direction are formed in an upper front surface 33 connected to the upper surface in which the aperture 31 is formed. Body portions 60a of bolt members 60 are passed through the slots 331 from the front, wherein the body portions 60a passing through the slots 331 are screwed into nuts 612 fixed to a plate member 61 so as to pass through through holes 611, larger than the slots 331, formed in the plate member 61, which is an elongated plate-like body. Also, although not shown in FIG. 10, stopper nuts 62 are fixed to leading end portions 60b of the bolt members 60 (refer to FIG. 18 and FIG. 19).

Figure 11:
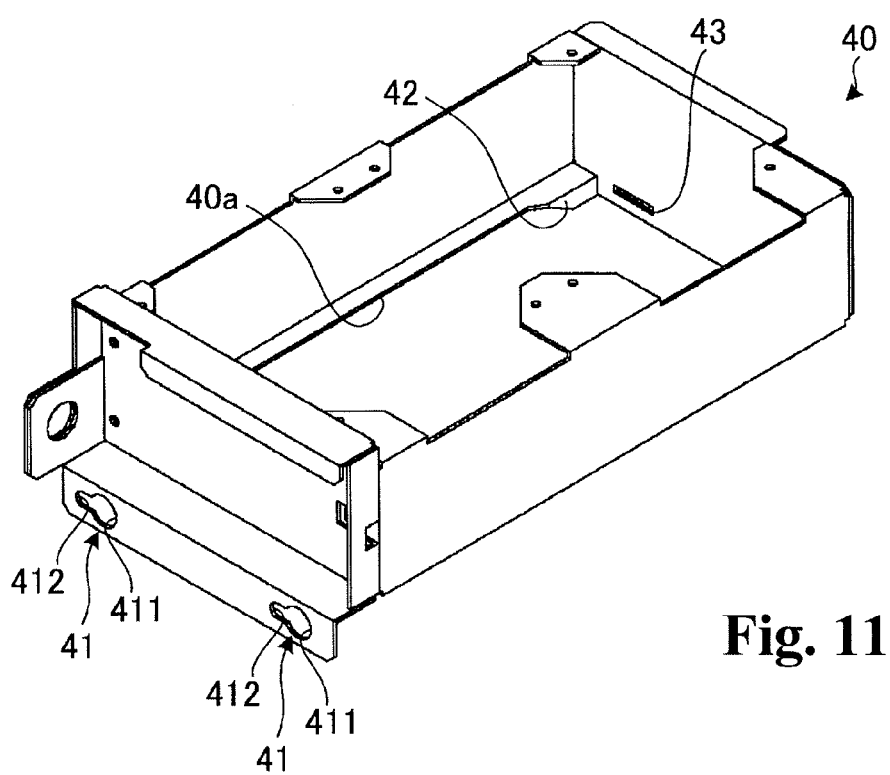
FIG. 11 is a perspective view showing the configuration of a fan block.

The fan block 40 is disposed on an upper portion of the inverter main body 30, and is of a box form in the interior of which are housed a plurality of fans F for sending air to the inverter main body 30. The fan block 40 forms a cuboid form of which the upper surface and lower surface are opened, as shown in FIG. 11.

An engagement hole 41, a flange 42, and a latch hole 43 are formed in this kind of fan block 40. A plurality (for example, two) of the engagement hole 41 is formed in a lower front surface of the fan block 40, that is, in the front surface of a portion extending downward from an extended end portion extending forward from a lower end portion of the front surface of the fan block 40. The engagement holes 41 are of a keyhole shape wherein an attachment hole portion 411, of a diameter larger than that of a head portion 60c of the bolt member 60, and a clamping hole portion 412, of a diameter smaller than that of the head portion 60c of the bolt member 60, are formed so as to be continuous.

The flange 42 is formed so as to extend downward at the rear side of a left-right lower side edge portion forming a lower surface aperture 40a of the fan block 40. The latch hole 43 is formed in the rear surface of the fan block 40, and is of a size such as to allow the protruding piece 321 to be inserted through.

Figure 12:
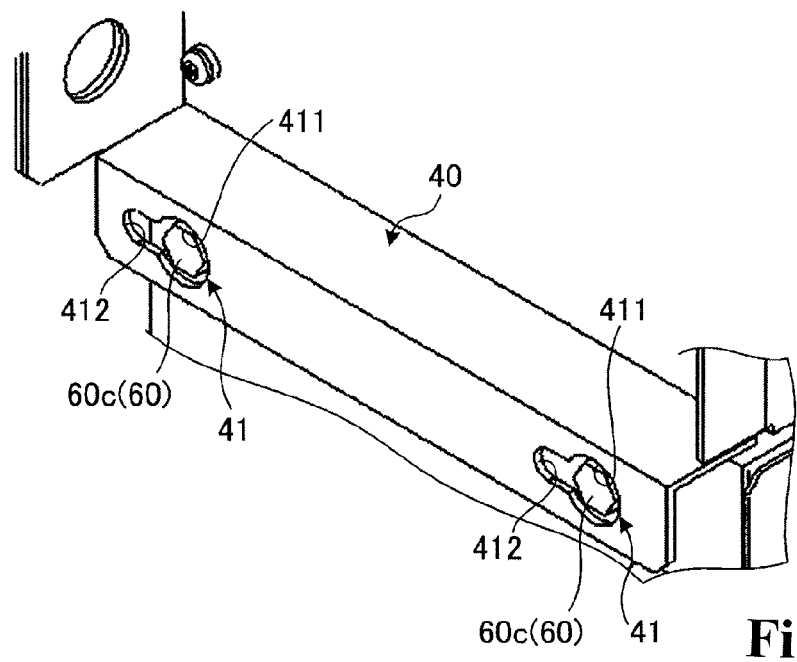
FIG. 12 is an illustration illustrating a procedure for disposing the fan block in the inverter main body.
Figure 13:
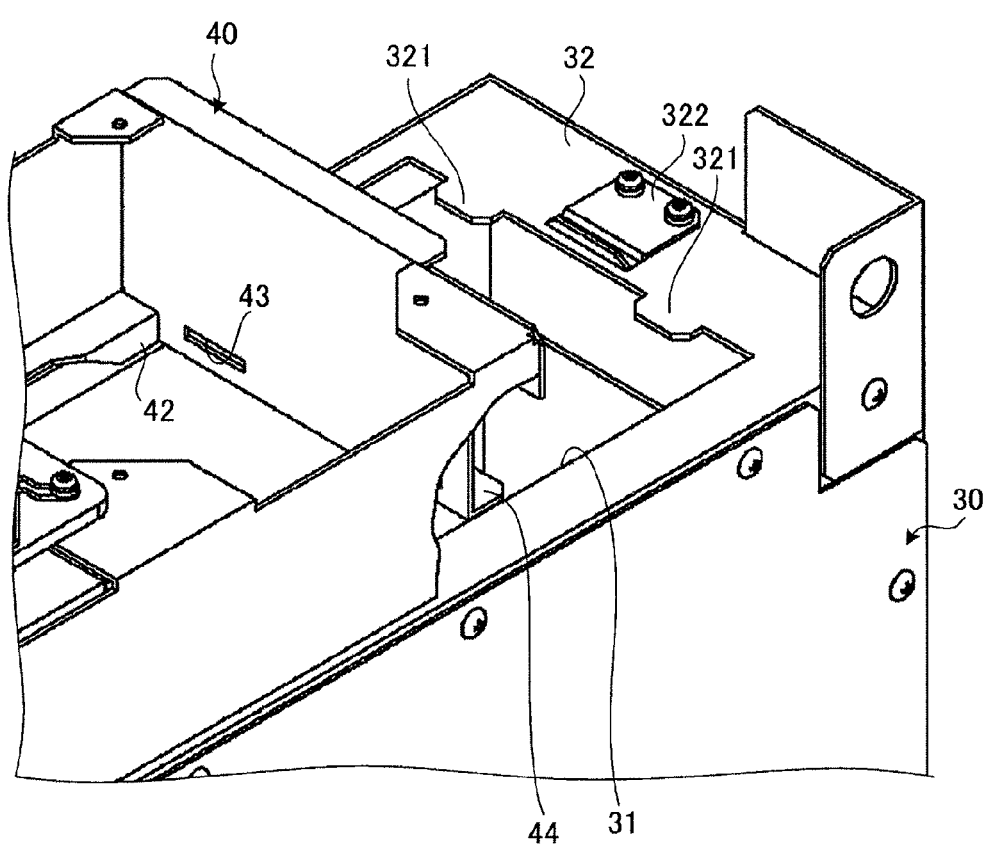
FIG. 13 is an illustration illustrating a procedure for disposing the fan block in the inverter main body.
Figure 14:
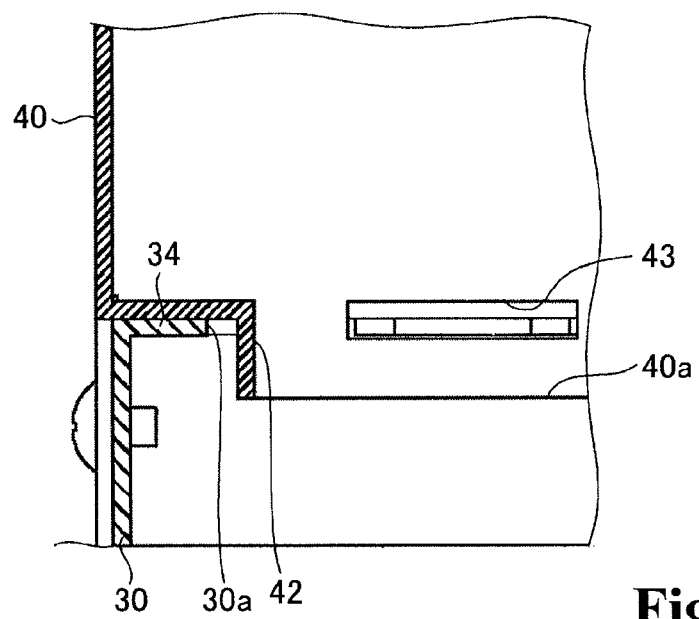
FIG. 14, which illustrates a procedure for disposing the fan block in the inverter main body, is an enlarged sectional view showing a state in which a main portion is viewed from the front side.

This kind of fan block 40 is engaged with and disposed on the inverter main body 30 in the following way. The fan block 40 is slid over the upper surface of the inverter main body 30 from the front toward the rear so that the head portions 60c of the bolt members 60 relatively pass through the attachment hole portions 411 of the engagement holes 41, as shown in FIG. 12. At this time, the flange 42 of the fan block 40 is positioned inward of an upper side edge portion 34 of the upper surface of the inverter main body 30 in which the aperture 31 is formed, as shown in FIG. 13 and FIG. 14, preventing the sliding fan block 40 from deviating more than necessary in a horizontal direction.

Figure 15:
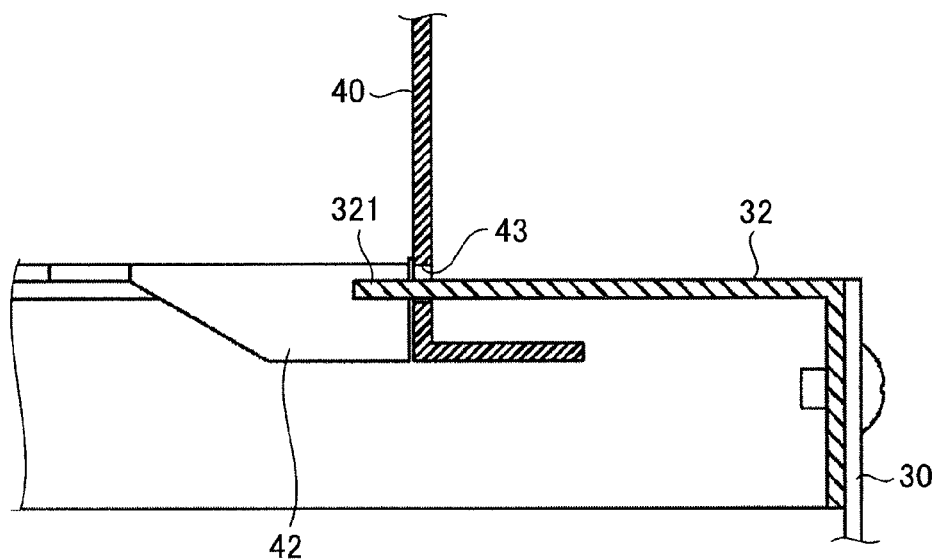
FIG. 15, which illustrates a procedure for disposing the fan block in the inverter main body, is an enlarged sectional view showing a state in which a main portion is viewed from the side.
Figure 16:
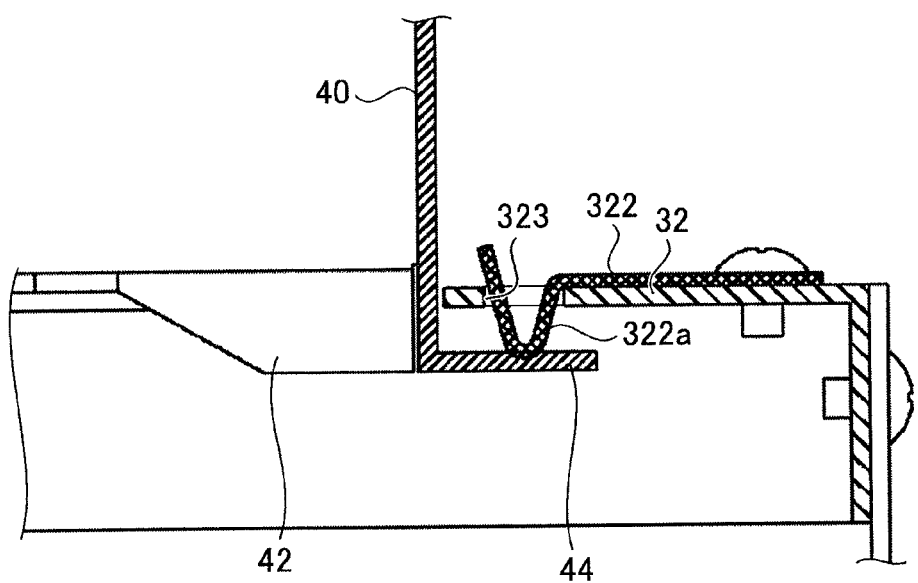
FIG. 16, which illustrates a procedure for disposing the fan block in the inverter main body, is an enlarged sectional view showing a state in which a main portion is viewed from the side.

Then, the protruding piece 321 of the inverter main body 30 is relatively inserted through the latch hole 43 of the fan block 40, as shown in FIG. 15, and the rear side of the fan block 40 engages with the inverter main body 30 by the leading end portion 322a of the plate spring member 322 holding down a rear extending portion 44 extending backward from a lower end portion of the rear surface of the fan block 40 with its own elastic restoring force, as shown in FIG. 16.

Figure 17:
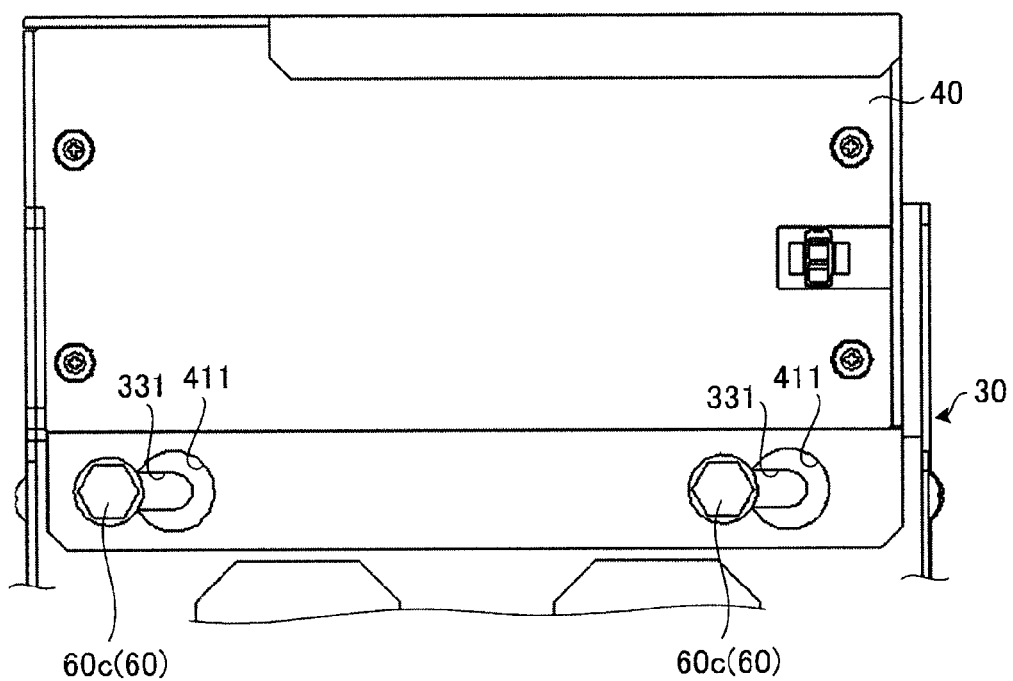
FIG. 17 is a front view of the fan block disposed on an upper portion of the inverter main body.
Figure 18:
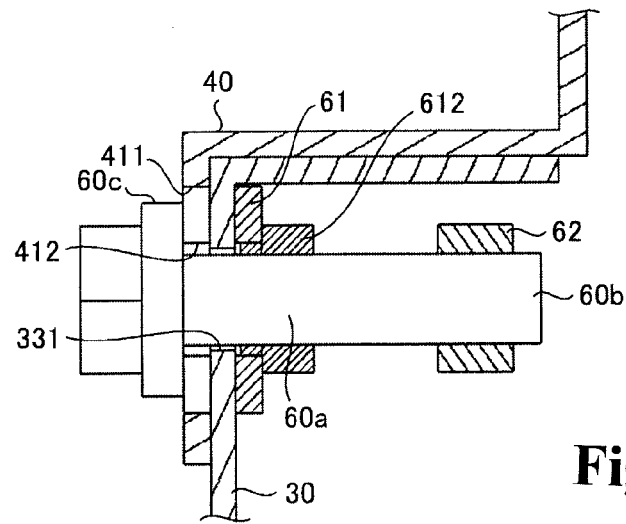
FIG. 18 is an enlarged sectional side view of a main portion of the fan block disposed on an upper portion of the inverter main body.
Figure 19:
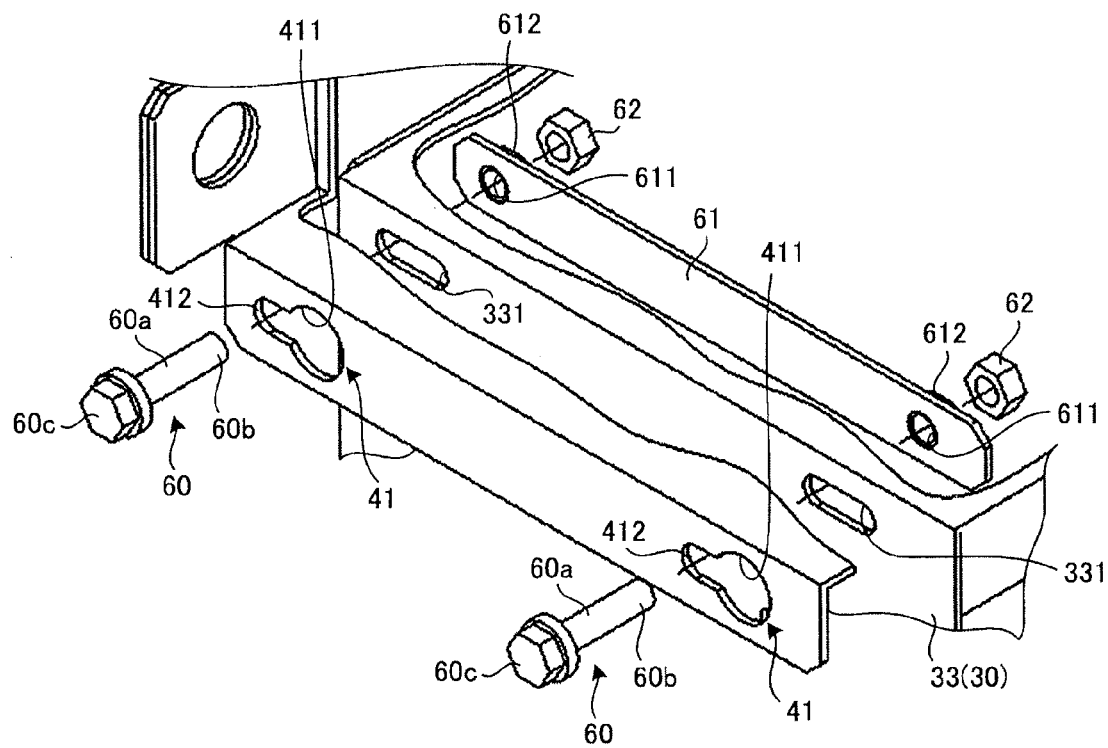
FIG. 19 is an exploded perspective view of a main portion of the fan block disposed on an upper portion of the inverter main body.

Subsequently, the front side of the fan block 40 engages with the inverter main body 30, as shown in FIG. 17 to FIG. 19, by the bolt members 60 being displaced in a horizontal direction so that the head portions 60c thereof move from the attachment hole portions 411 to the clamping hole portions 412, and the bolt members 60 being tightened. By so doing, it is possible to dispose the fan block 40 on the upper surface of the inverter main body 30.

Figure 20:
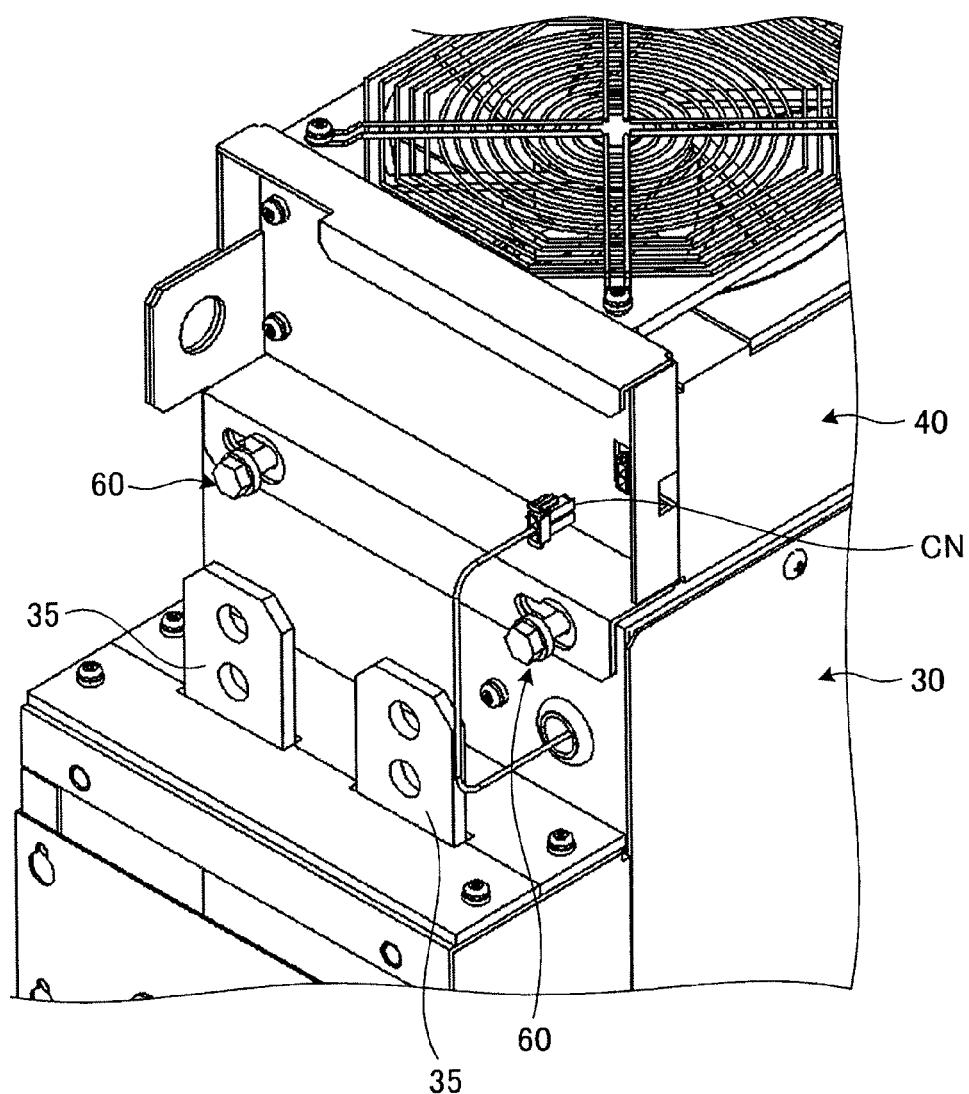
FIG. 20 is an illustration for illustrating a procedure for removing the fan block from the inverter main body.
Figure 21:
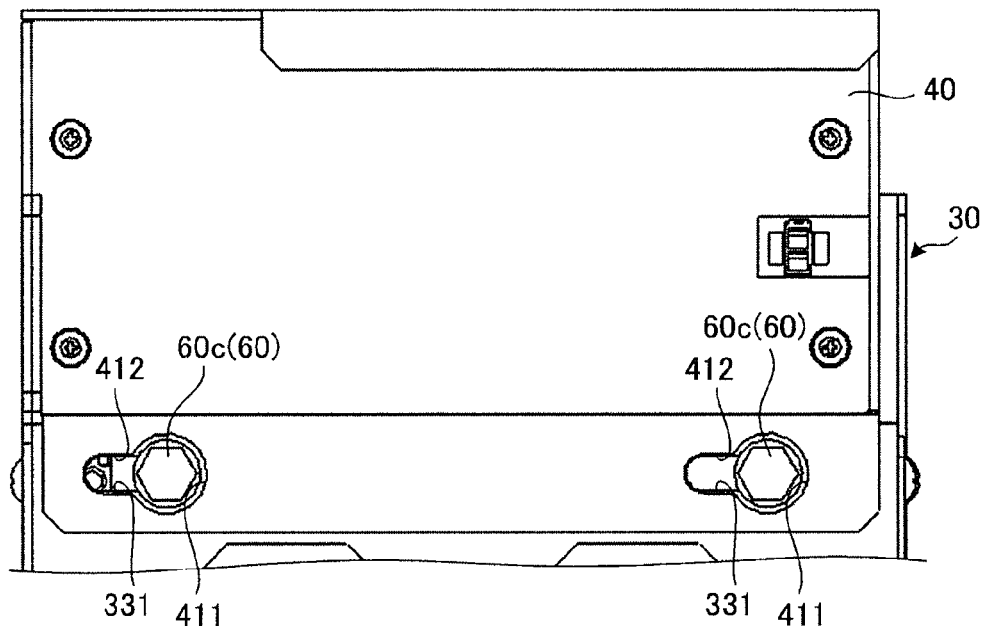
FIG. 21 is a front view for illustrating a procedure for removing the fan block from the inverter main body.
Figure 22:
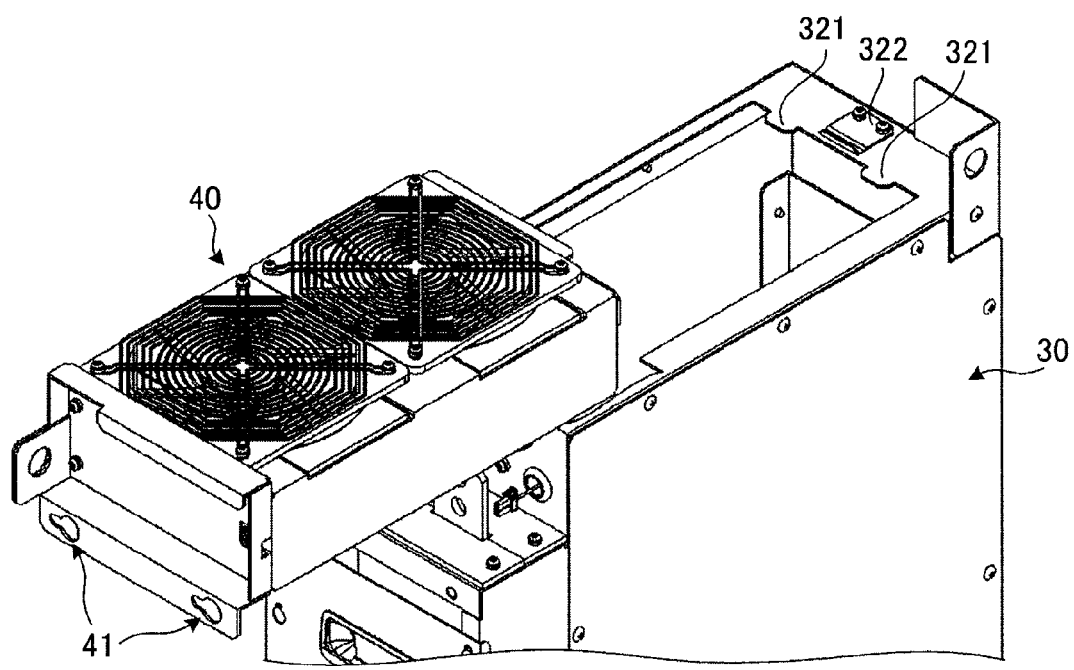
FIG. 22 is an illustration for illustrating a procedure for removing the fan block from the inverter main body.

Meanwhile, this kind of fan block 40 is removed from the inverter main body 30 in the following way. A connector CN attached to the fan block 40 is removed, thereby releasing the tightening force of the bolt members 60, as shown in FIG. 20. Subsequently, the bolt members 60 are displaced in a horizontal direction so that the head portions 60c thereof move from the clamping hole portions 412 to the attachment hole portions 411, as shown in FIG. 21. Then, the fan block 40 is removed from the inverter main body 30 by the fan block 40 being pulled out to the front side, as shown in FIG. 22.

That is, between the inverter main body 30 and fan block 40, the bolt members 60, engagement holes 41, protruding pieces 321, latch hole 43, and plate spring member 322 configure engagement means that causes the fan block 40 to engage with the inverter main body 30. In particular, the bolt members 60 and engagement holes 41 are formed such that, when the bolt members 60 are tightened in a condition wherein the body portions 60a of the bolt members 60 are passed through the clamping hole portions 412 of the engagement holes 41, the fan block 40 is engaged with the inverter main body 30, while when the body portions 60a are passed through the attachment hole portions 411 of the engagement holes 41 by the tightening force of the bolt members 60 being released and the bolt members 60 being slid in a horizontal direction relative to the engagement holes 41, the fan block 40 is allowed to be disengaged from the inverter main body 30 by being pulled out to the front side.

The inverter stack 10 having this kind of configuration is housed and installed in the switchboard 50 in the following way.

Figure 23:
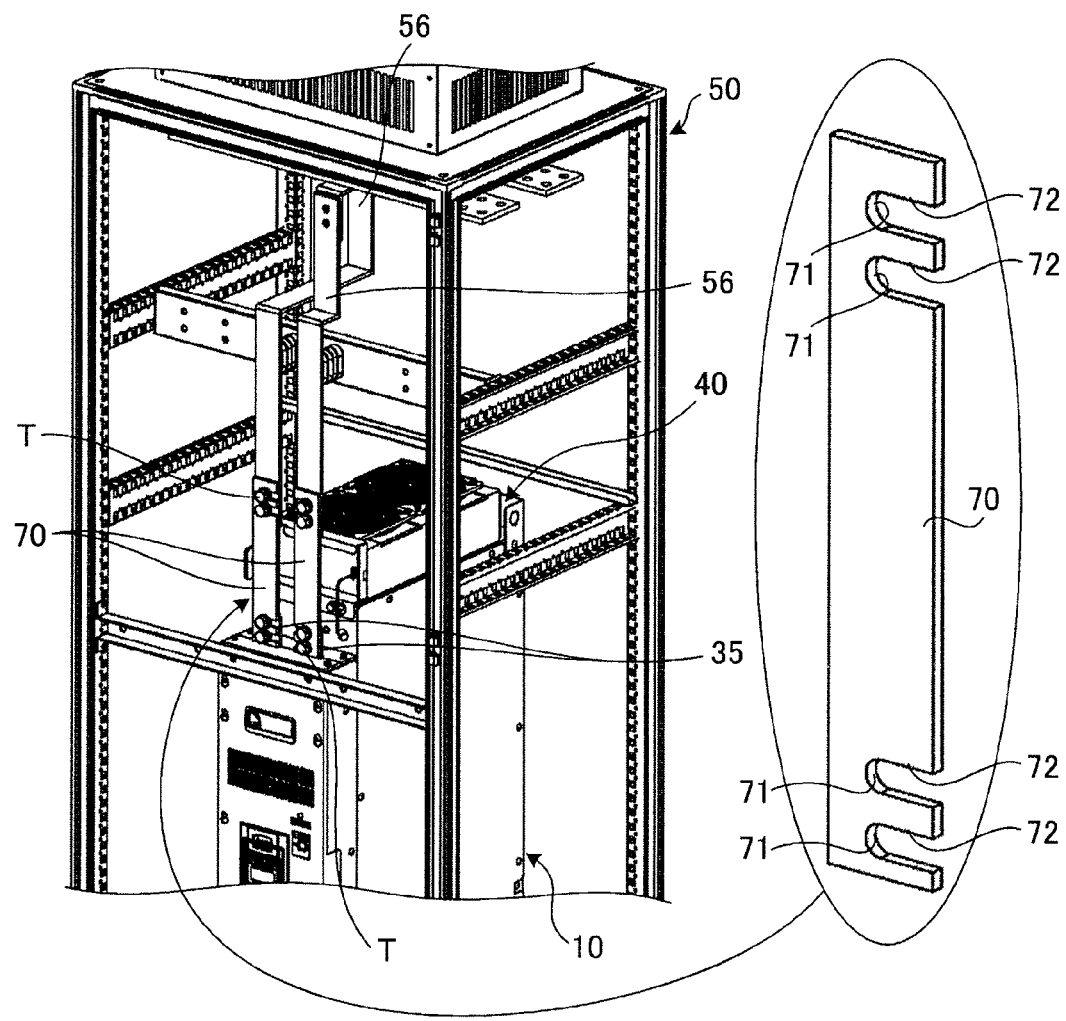
FIG. 23 is a perspective view showing an input side connection condition of the inverter stack and switchboard.
Figure 24:
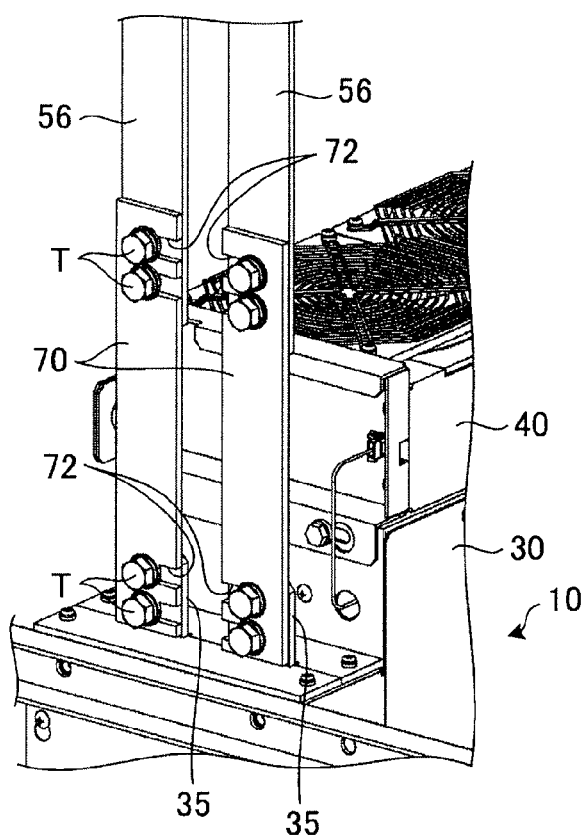
FIG. 24 is an enlarged perspective view showing an enlargement of a main portion shown in FIG. 23.

FIG. 23 is a perspective view showing an input side connection condition of the inverter stack 10 and switchboard 50, while FIG. 24 is an enlarged perspective view showing an enlargement of a main portion shown in FIG. 23. As shown in FIG. 23 and FIG. 24, the inverter stack 10 is formed such that two input terminals 35 provided on the inverter main body 30 are each linked via an input relay bar 70 to an input side terminal 56 of the switchboard 50.

The input relay bar 70 is a plate-shaped member that links the input side terminal 56 and input terminal 35 as heretofore described by an upper end portion thereof being fastened via fastening members T to the corresponding input side terminal 56 of the switchboard 50 and a lower end portion thereof being fastened via fastening members T to the corresponding input terminal 35 of the inverter stack 10.

Further, in each input relay bar 70, cutouts 72 are formed communicating with the same side portion (the right side portion or left side portion) in hole portions 71 through which bolts, which are the fastening members T, pass.

Figure 25:
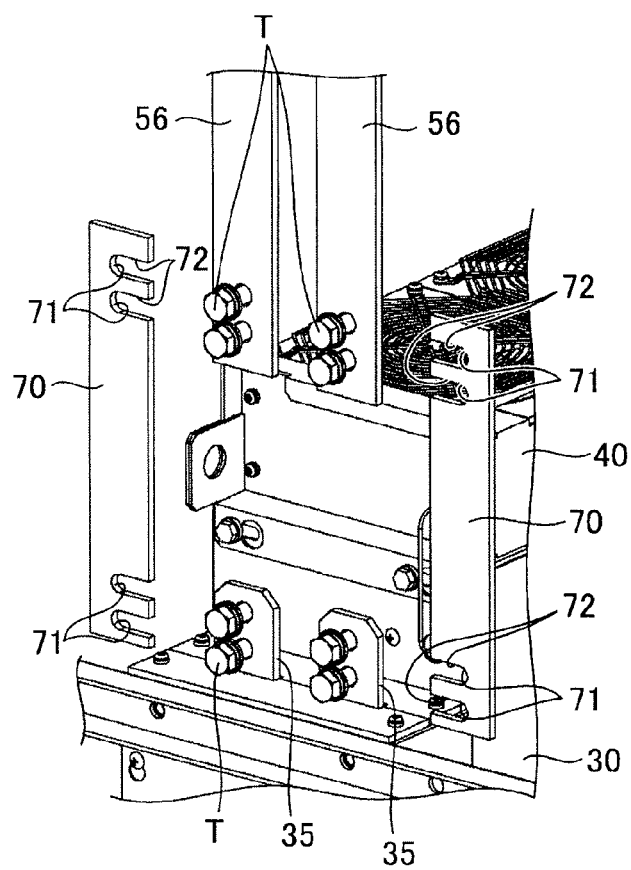
FIG. 25 is a perspective view showing a release of the input side connection condition of the inverter stack and switchboard.

As the cutouts 72 are formed in the hole portions 71 of the input relay bar 70 in this way, it is possible to disengage the input relay bar 70, without removing the fastening members T, by releasing the tightening force of the fastening members T, as shown in FIG. 25.

Figure 26:
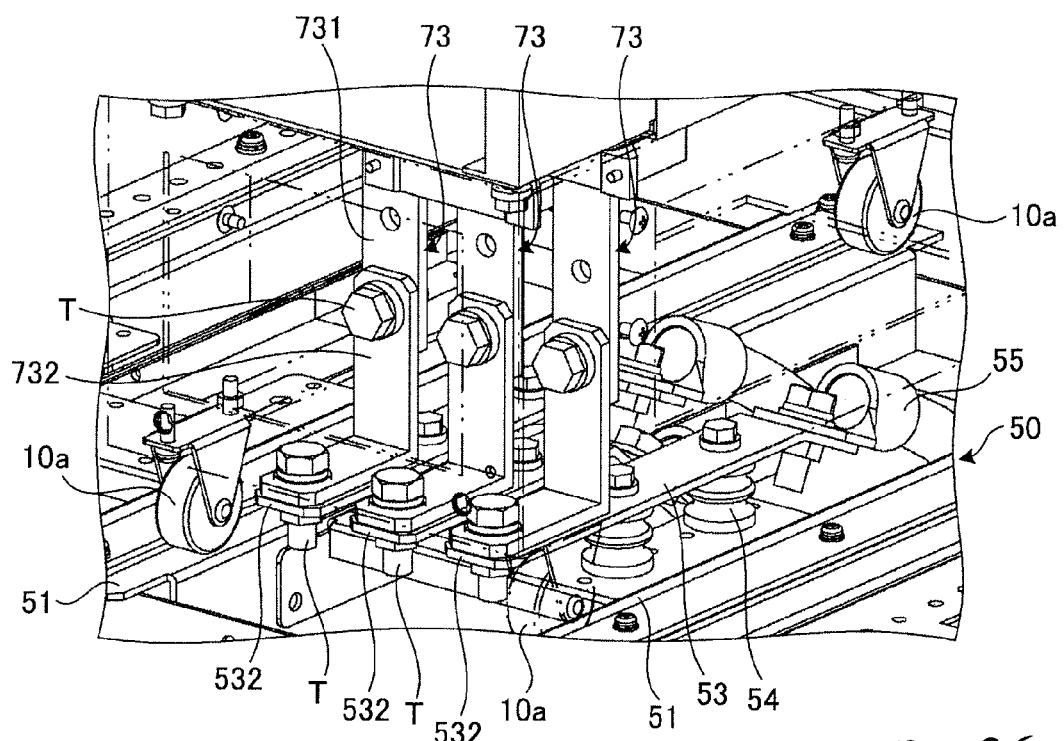
FIG. 26 is a perspective view showing an output side connection condition of the inverter stack and switchboard.

FIG. 26 is a perspective view showing an output side connection condition of the inverter stack 10 and switchboard 50. As shown in FIG. 26 and also in the heretofore described FIG. 8, three output terminals (not shown) provided on the inverter main body 30 are each linked via an output relay bar 73 to the front surface end portion 532 of the output relay terminal 53 of the switchboard 50. Herein, three of the output relay bar 73 being provided, there is one that links a U-phase output terminal and the U-phase output relay terminal 53, one that links a V-phase output terminal and the V-phase output relay terminal 53, and one that links a W-phase output terminal and the W-phase output relay terminal 53.

Each of this kind of output relay terminal bar 73 has the same configuration, and includes a first output relay bar 731 and second output relay bar 732. The first output relay bar 731 extends in a vertical direction, and an upper end portion thereof is linked to the corresponding output terminal.

Figure 27:
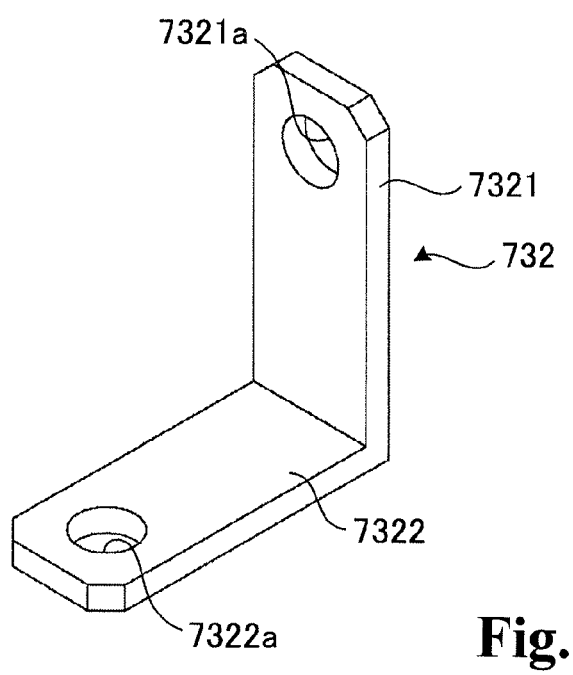
FIG. 27 is a perspective view showing a second output relay bar configuring an output relay bar shown in FIG. 26.

The second output relay bar 732 has an L-shaped longitudinal section form, and more specifically, has a base portion 7321 and leading end portion 7322, as shown in FIG. 27. The base portion 7321 is a region extending in a vertical direction and protruding downward from the bottom portion of the inverter stack 10, wherein an upper end portion thereof is fastened via a fastening member T to a lower end portion of the first output relay bar 731. The leading end portion 7322 is a region extending forward from a lower end portion of the base portion 7321, and is fastened via a fastening member T to the front surface end portion 532 of the corresponding output relay terminal 53. That is, the output relay terminal 53 provided in the switchboard 50 is formed such that the output wire 55 connected to a load such as a motor is attached to the rear surface end portion 531, and the front surface end portion 532 is linked to the output terminal of the inverter stack 10 and fastened via a fastening member T to the output relay bar 73 protruding downward from the bottom portion of the inverter stack 10.

An insertion hole 7321a in the base portion 7321 through which the fastening member T is inserted, and an insertion hole 7322a in the leading end portion 7322 through which the fastening member T is inserted, are formed in this kind of second output relay bar 732 so as to have a diameter larger than the outer diameter of the fastening member T.

Because of this, it is possible to absorb dimensional tolerance in a horizontal direction and vertical direction with the insertion hole 7321a of the base portion 7321, and possible to absorb dimensional tolerance in a horizontal direction and longitudinal direction with the insertion hole 7322a of the leading end portion 7322.

Figure 28:
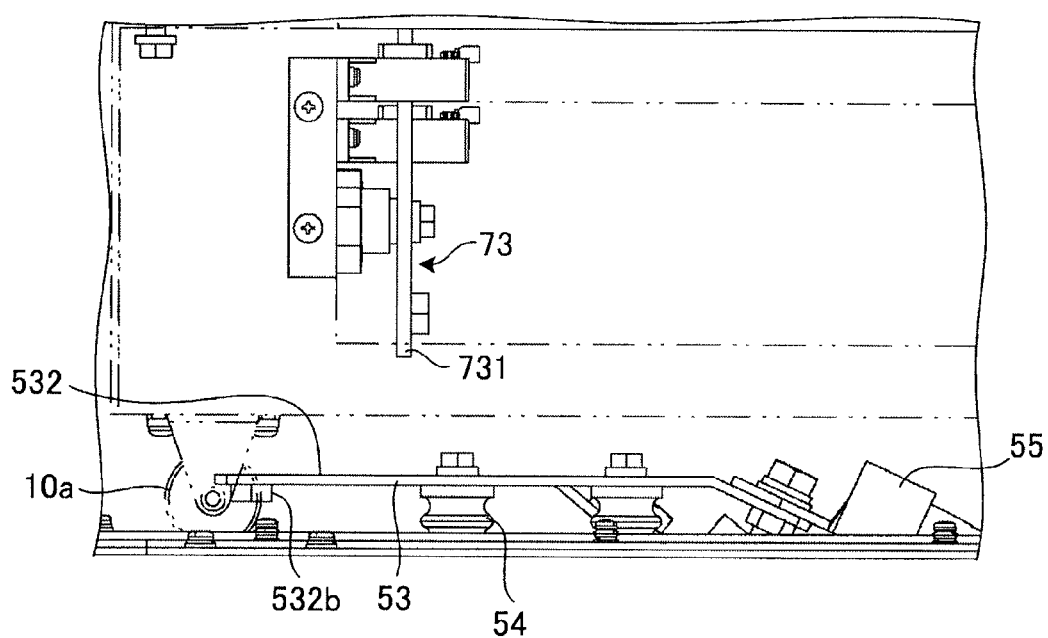
FIG. 28 is a side view showing a condition in which the second output relay bar configuring the output relay bar shown in FIG. 26 has been removed.

Also, the output relay bar 73 is formed such that it is possible to implement the setting up of a single inverter that inspects the drive of the inverter stack 10 by removing the second output relay bar 732 from both the first output relay bar 731 and the corresponding output relay terminal 53, as shown in FIG. 28.

Figure 29:
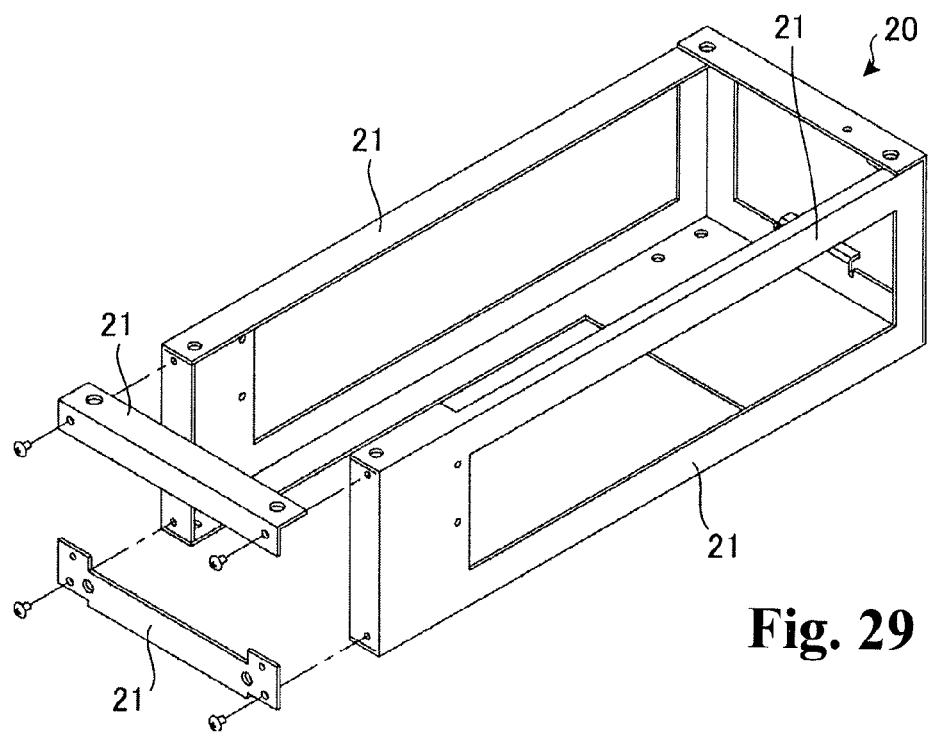
FIG. 29 is an illustration showing the configuration of a lower frame.

As the output relay bar 73 is provided so as to pass through the lower frame 20 of the inverter stack 10, the lower frame 20 is formed such that the frame members 21 configuring one side of a four-sided frame through which the output relay bar 73 passes, that is, the frame member 21 configuring a front upper side and the frame member 21 configuring a front lower side, are formed of a non-magnetic body such as, for example, stainless steel, while the other frame members 21 are formed of sheet-metal, or the like, as shown in FIG. 29.

By the frame members 21 configuring one side of the four-sided frame through which the output relay bar 73 passes being formed of a non-magnetic body in this way, it is possible to control the occurrence of an overcurrent.

Figure 30:
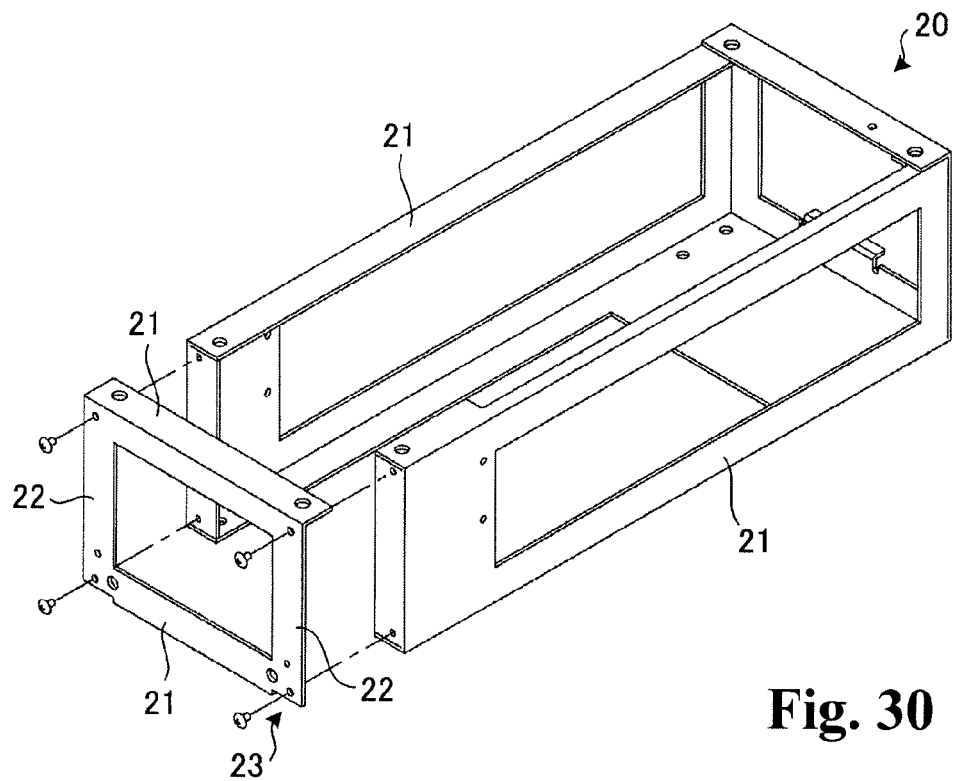
FIG. 30 is an illustration showing the configuration of a modification example of the lower frame.

In FIG. 29, the frame member 21 configuring the front upper side and the frame member 21 configuring the front lower side are formed of a non-magnetic body as one side of the four-sided frame through which the output relay bar 73 passes, but the lower frame 20 of the embodiment is formed such that a front portion 23 of the lower frame 20, formed of longitudinal frame members 22 configuring a left-right pair of front longitudinal sides linking the frame member 21 configuring the front upper side and the frame member 21 configuring the front lower side, may be formed of a non-magnetic body such as, for example, stainless steel, as shown in FIG. 30.

With this kind of configuration too, by the frame members 21 configuring one side of the four-sided frame through which the output relay bar 73 passes being formed of a non-magnetic body, it is possible to control the occurrence of an overcurrent.

The heretofore described inverter device is formed such that the output relay bars 73 are an output relay unit, wherein one linking the U-phase output terminal and U-phase output relay terminal 53, one linking the V-phase output terminal and V-phase output relay terminal 53, and one linking the W-phase output terminal and W-phase output relay terminal 53 are shown, but in the embodiment, an output relay unit alternatively selected from a first output relay unit 80 and second output relay unit 90 may be used as the output relay unit instead of the output relay bar 73.

Figure 31:
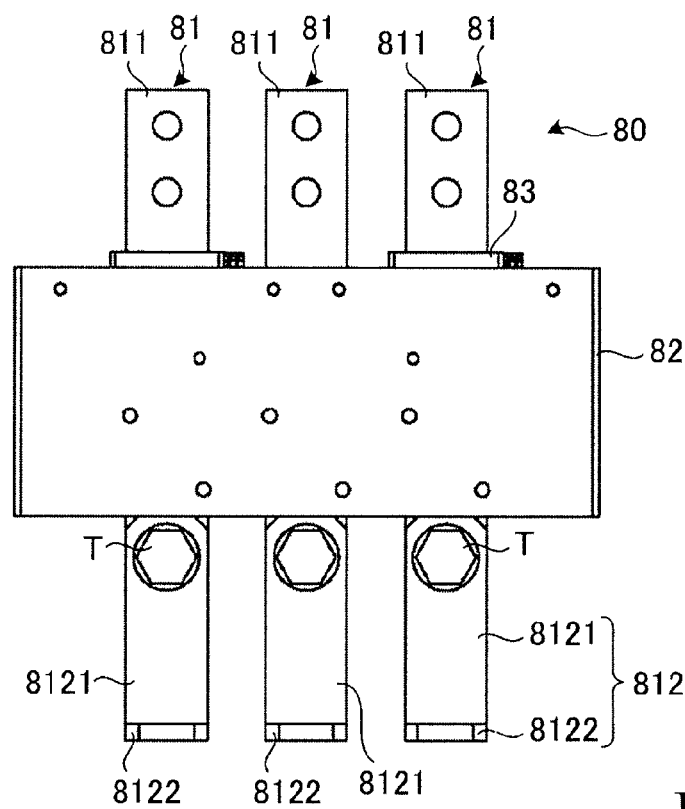
FIG. 31 is a front view showing a first output relay unit.
Figure 32:
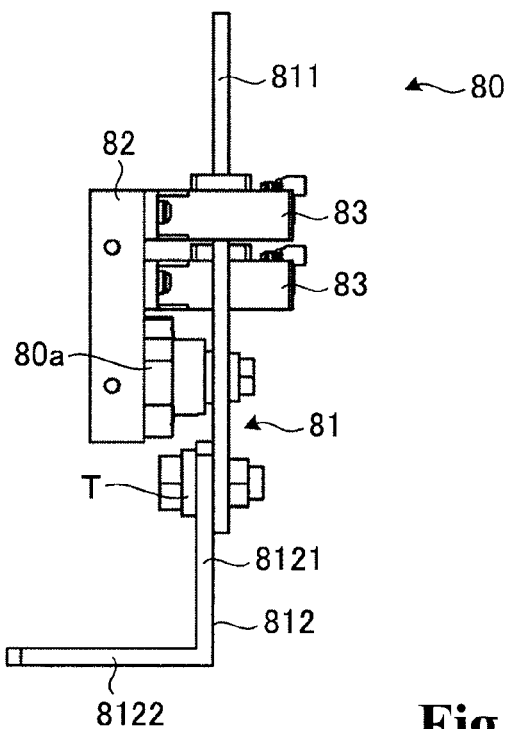
FIG. 32 is a side view showing the first output relay unit.
Figure 33:
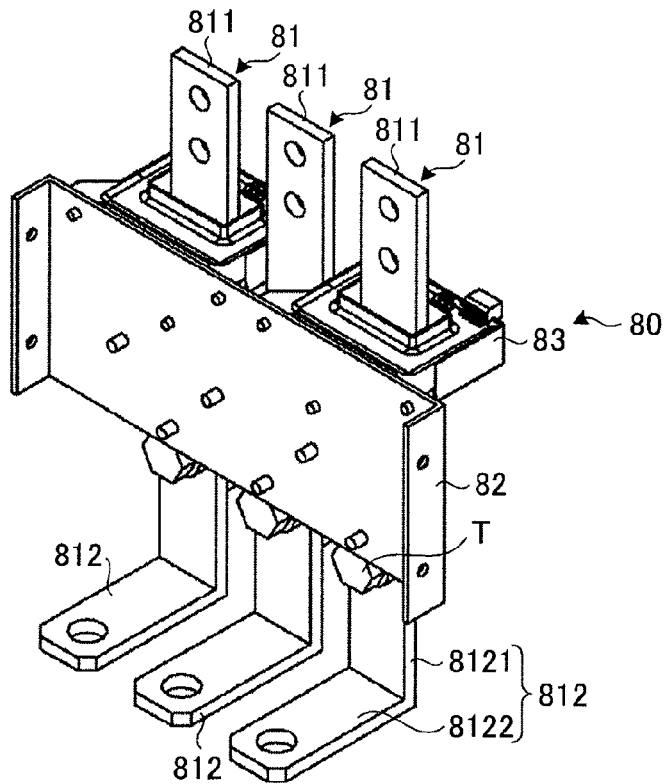
FIG. 33 is a perspective view of the first output relay unit viewed from the front side.
Figure 34:
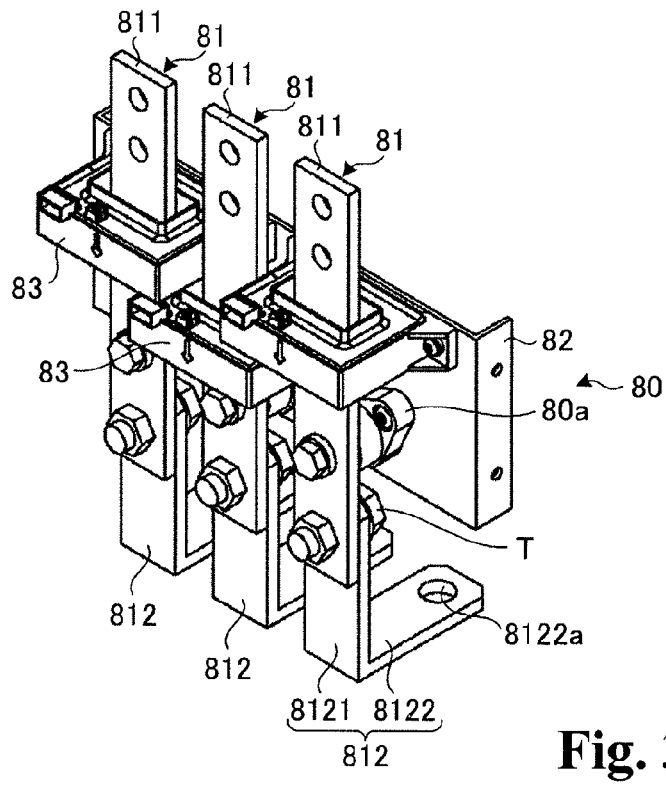
FIG. 34 is a perspective view of the first output relay unit seen from the rear side.

Each of FIG. 31 to FIG. 34 shows the first output relay unit 80, wherein FIG. 31 is a front view, FIG. 32 is a side view, FIG. 33 is a perspective view viewed from the front, and FIG. 34 is a perspective view viewed from the rear.

The first output relay unit 80 illustrated here includes three output relay bars 81 and a fixing plate 82. The three output relay bars 81 are one that links the U-phase output terminal and the U-phase output relay terminal 53, one that links the V-phase output terminal and the V-phase output relay terminal 53, and one that links the W-phase output terminal and the W-phase output relay terminal 53.

The three output relay bars 81 include a first output relay bar 811 and second output relay bar 812. The first output relay bar 811 extends in a vertical direction, and an upper end portion thereof can be linked to the corresponding output terminal. The second output relay bar 812 has an L-shaped longitudinal section form, and more specifically, has a base portion 8121 and leading end portion 8122. The base portion 8121 extends in a vertical direction, and an upper end portion thereof is fastened via a fastening member T to a lower end portion of the first output relay bar 811. The leading end portion 8122 is a region extending forward from a lower end portion of the base portion 8121, and can be fastened via a fastening member T to the front surface end portion 532 of the corresponding output relay terminal 53. Further, an insertion hole (not shown) in the base portion 8121 through which the fastening member T is inserted, and an insertion hole 8122a in the leading end portion 8122 through which the fastening member T is inserted, are formed in the second output relay bar 812 so as to have a diameter larger than the outer diameter of the fastening member T.

The fixing plate 82 is configured by carrying out an appropriate bending process on sheet-metal, and is integrally linked with the three output relay bars 81 across resin 80a, which is an insulating member, thereby forming a unit. This kind of fixing plate 82 is for fixing the first output relay unit 80 in the inverter stack 10. References 83 in FIGS. 31 to 34 are Hall effect current transformers, and carry out current detection.

As this kind of first output relay unit 80 has the three output relay bars 81, the three phases of output from the output terminals can be output as they are to the output relay terminals 53.

Figure 35:
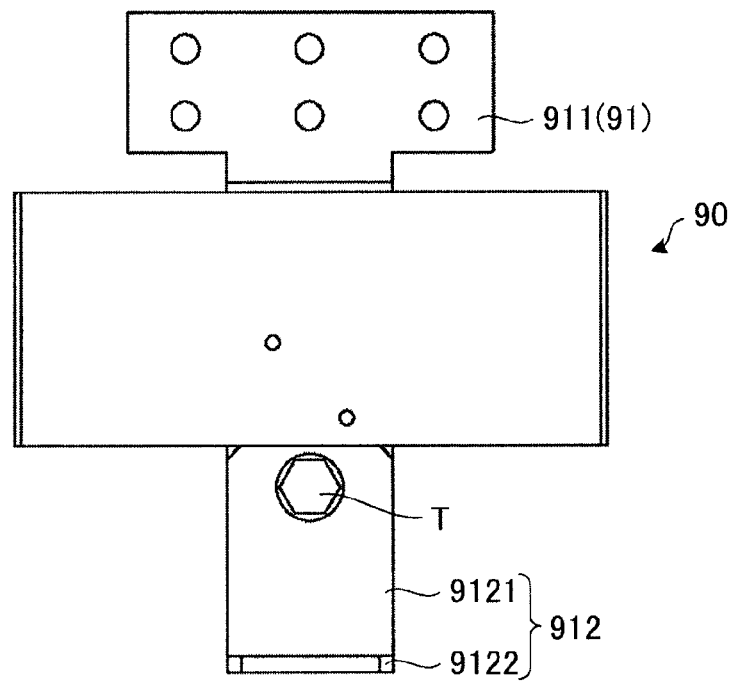
FIG. 35 is a front view showing a second output relay unit.
Figure 36:
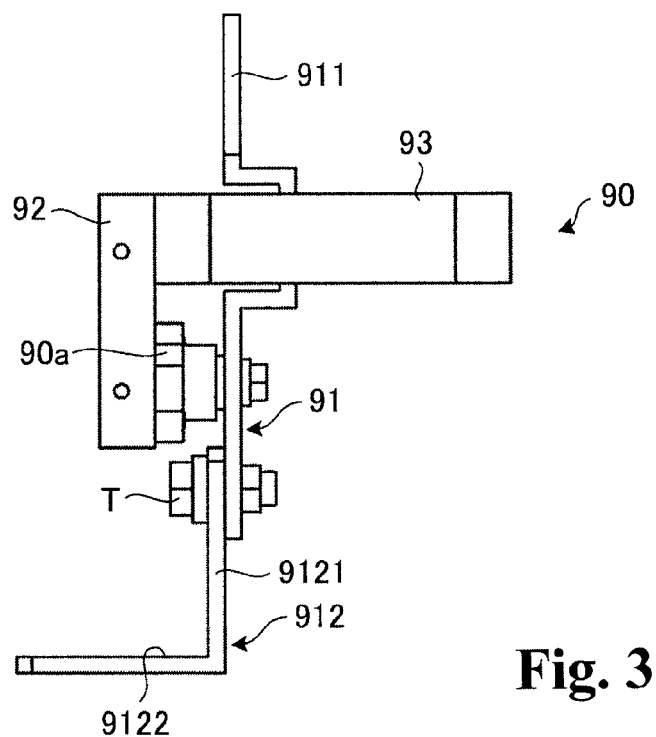
FIG. 36 is a side view showing the second output relay unit.
Figure 37:
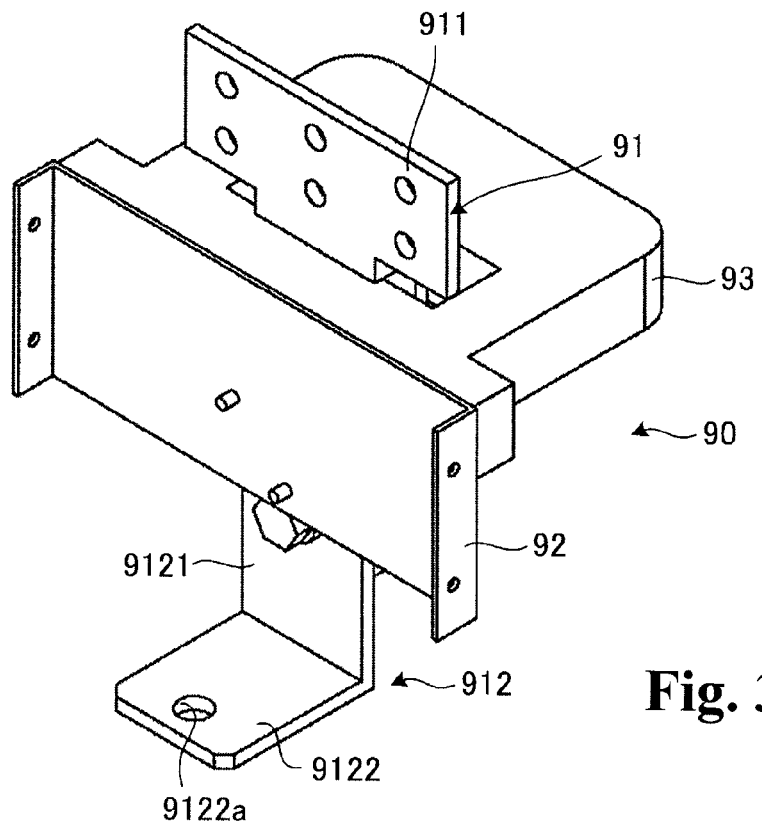
FIG. 37 is a perspective view of the second output relay unit viewed from the front.
Figure 38:
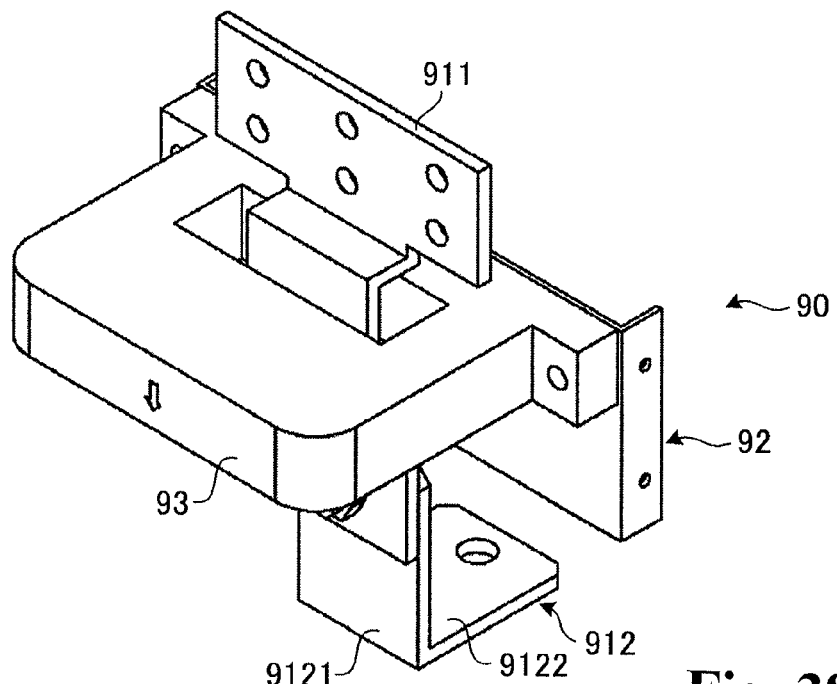
FIG. 38 is a perspective view of the second output relay unit viewed from behind.

Each of FIG. 35 to FIG. 38 shows the second output relay unit 90, wherein FIG. 35 is a front view, FIG. 36 is a side view, FIG. 37 is a perspective view viewed from the front, and FIG. 38 is a perspective view viewed from the rear.

The second output relay unit 90 illustrated here includes one output relay bar 91 and a fixing plate 92. The output relay bar 91 includes a first output relay bar 911 and second output relay bar 912. The first output relay bar 911 extends in a vertical direction, and an upper end portion thereof can be linked to the three output terminals.

The second output relay bar 912 has an L-shaped longitudinal section form, and more specifically, has a base portion 9121 and leading end portion 9122. The base portion 9121 extends in a vertical direction, and an upper end portion thereof is fastened via a fastening member T to a lower end portion of the first output relay bar 911. The leading end portion 9122 is a region extending forward from a lower end portion of the base portion 9121, and can be fastened via a fastening member T to the front surface end portion 532 of any output relay terminal 53. Further, an insertion hole (not shown) in the base portion 9121 through which the fastening member T is inserted, and an insertion hole 9122a in the leading end portion 9122 through which the fastening member T is inserted, are formed in the second output relay bar 912 so as to have a diameter larger than the outer diameter of the fastening member T.

The fixing plate 92 is configured by carrying out an appropriate bending process on sheet-metal, and is integrally linked with the output relay bar 91 across resin 90a, which is an insulating member, thereby forming a unit. This kind of fixing plate 92 is for fixing the second output relay unit 90 in the inverter stack 10. References 93 in FIGS. 35 to 38 are Hall effect current transformers, and carry out current detection.

As this kind of second output relay unit 90 has the one output relay bar 91, the three phases of output from the output terminals can be output to the output relay terminals 53 as a single phase, which is one of the U-phase, V-phase, or W-phase.

Figure 39:
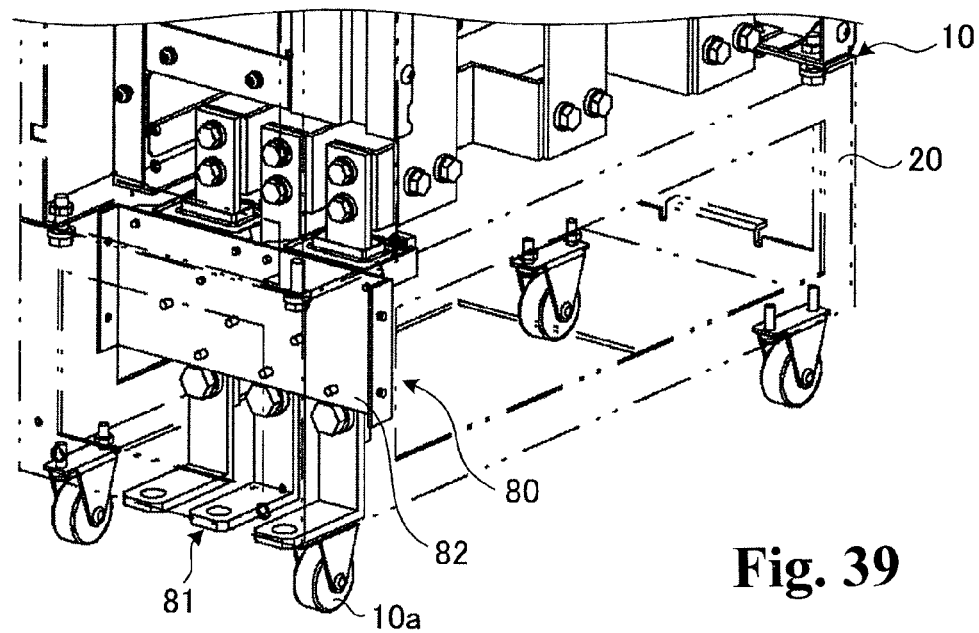
FIG. 39 is an illustration showing a condition in which the first output relay unit shown in FIG. 31 to FIG. 34 is installed.
Figure 40:
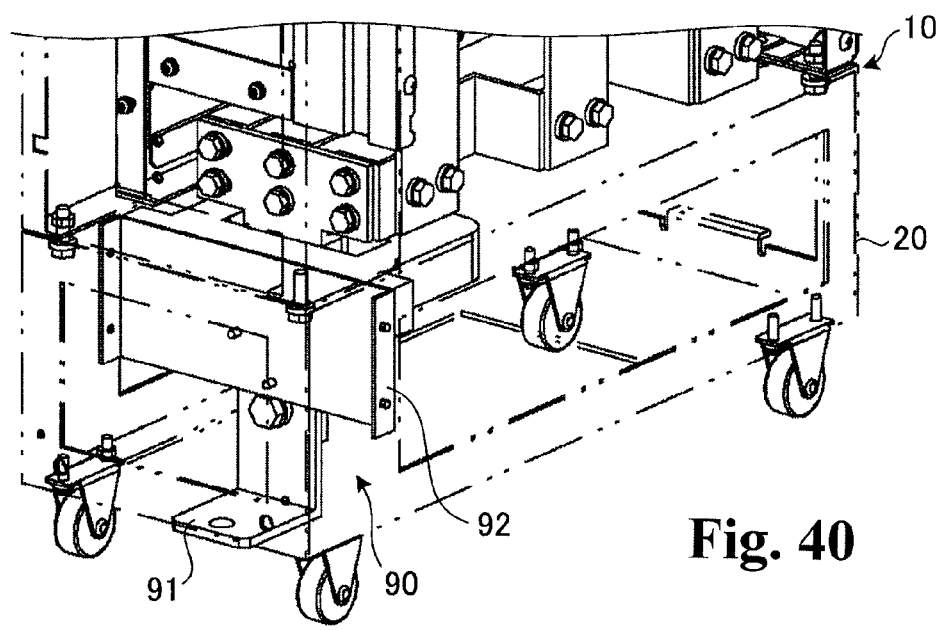
FIG. 40 is an illustration showing a condition in which the second output relay unit shown in FIG. 35 to FIG. 38 is installed.

Further, the first output relay unit 80 may be used as the output relay unit by fixing it to the lower frame 20 of the inverter stack 10 via the fixing plate 82 and fastening the output relay bars 81 to the output terminals and output relay terminals 53, as shown in FIG. 39, or the second output relay unit 90 may be used as the output relay unit by fixing it to the lower frame 20 of the inverter stack 10 via the fixing plate 92 and fastening the output relay bar 91 to the output terminals and one of the output relay terminals 53, as shown in FIG. 40.

As heretofore described, the transport cart 1 is formed such that the support surface 3 that supports the inverter stack 10 in a mounted condition has a height level the same as that of the inverter stack 10 mounting surfaces 51 in the switchboard 50 in which the inverter stack 10 is to be installed, and positioning in a horizontal direction is carried out by the protruding portion 3a provided so as to protrude outward from the support surface 3 entering the entrance portion 52 of the switchboard 50 formed between the mounting surfaces 51, because of which there is no need for high positioning accuracy, as there is with a heretofore used lifter. Moreover, there is no need for a mechanism, or the like, that moves a support base in a vertical direction, as there is with a lifter. Consequently, according to the transport cart 1, it is possible to more easily install the inverter stack 10 in the switchboard 50, while achieving a reduction in cost.

Also, according to the transport cart 1, the rail guides 4 disposed on the support surface 3 in the direction in which the inverter stack 10 can move restrict deviation in a horizontal direction with respect to the direction of movement when moving the inverter stack 10, because of which it is possible to carry out the inverter stack 10 installation work well.

Furthermore, according to the transport cart 1, the inverter stack 10 is fixed and supported by the fixing plate 5 standing upright from the support surface 3 being fastened via fastening members such as the screws N1 to the inverter stack 10 supported by the support surface 3, because of which it is possible to prevent the inverter stack 10 from falling even during transportation.

Further still, according to the transport cart 1, the gripping portions 6 are provided so as to form a left-right pair on the base 2 including the support surface 3, because of which it is possible to transport the inverter stack 10 well, even in a narrow passage, or the like.

The inverter stack 10 is formed such that, when the bolt members 60 are tightened in a condition wherein the body portions 60a of the bolt members 60 are passed through the clamping hole portions 412 of the engagement holes 41, the fan block 40 is engaged with the inverter main body 30, while when the body portions 60a are passed through the attachment hole portions 411 of the engagement holes 41 by the tightening force of the bolt members 60 being released and the bolt members 60 being slid in a horizontal direction relative to the engagement holes 41, the fan block 40 is allowed to be disengaged from the inverter main body 30 by being pulled out to the front side, because of which it is possible to disengage the fan block 40 from the inverter main body 30 even when the width of the housing region in which the inverter stack 10 is installed is small, and thus possible to easily carry out the work of removing the fan block 40. In particular, according to the inverter stack 10, the stopper nuts 62 are fixed to the leading end portions 60b of the bolt members 60, because of which the bolt members 60 do not fall out even when the tightening force of the bolt members 60 is released. Consequently, it is possible to prevent the bolt members 60 from falling out when disengaging the fan block 40 from the inverter main body 30.

Also, according to the inverter stack 10, when the fan block 40 is disposed on the upper surface of the inverter main body 30, the protruding piece 321 of the inverter main body 30 is inserted through the latch hole 43 of the fan block 40, and furthermore, the rear extending portion 44 of the fan block 40 is held down by the plate spring member 322 attached to the inverter main body 30, because of which it is sufficient simply to push the fan block 40 in toward the rear, and thus possible to carry out the fan block 40 installation work well.

The heretofore described inverter device is formed such that the output relay terminals 53 are provided so as to extend in the inverter stack 10 entry direction in the housing bottom portion in which the inverter stack 10 is housed, the output wire 55 connected to a load such as a motor is attached to the rear surface end portion 531, and the front surface end portion 532 is linked to the output terminal of the inverter stack 10 and fastened via the fastening member T to the output relay bar 73 protruding downward from the bottom portion of the inverter stack 10, because of which it is possible to release the output side connection condition of the inverter stack 10 and switchboard 50 simply by releasing the fastenings of the output relay terminals 53 and output relay bars 73. Consequently, according to the inverter device, it is possible to easily remove the inverter stack 10 from the switchboard 50.

Also, according to the inverter device, the input relay bar 70 is formed such that, as the fastening members T, such as bolts, are inserted through the hole portions 71 in which are formed the cutouts 72 communicating with the same side portion, it is possible to disengage the input relay bar 70, without removing the fastening members T, by releasing the tightening force of the fastening members T, and thus possible to release the input side connection condition of the inverter stack 10 and switchboard 50. Consequently, for this reason too, it is possible to easily remove the inverter stack 10 from the switchboard 50.

Furthermore, according to the inverter device, the lower frame 20 configuring the inverter stack 10 is formed such that, as the frame members 21 configuring one side of the four-sided frame through which the output relay bar 73 passes are formed of a non-magnetic body, it is possible to control the occurrence of an overcurrent, because of which it is possible to prevent heating and vibration due to the occurrence of an overcurrent, or the like. Also, as the other frame members 21 of the lower frame 20 are configured of sheet-metal or the like, it is possible to reduce manufacturing cost in comparison with when forming all the frame members of a non-magnetic body such as stainless steel. Consequently, it is possible to achieve a reduction in manufacturing cost while preventing heating and vibration due to the occurrence of an overcurrent, or the like. Provided that it is clear that no overcurrent due to the magnitude of the current transmitted through the output relay bar 73 will occur in the lower frame 20, the frame members 21 formed of a non-magnetic body may be replaced with frame members formed of a magnetic body such as sheet-metal. When it is clear in this way that no overcurrent will occur, it is possible to achieve a reduction in operational cost by configuring all the frame members 21 configuring the lower frame 20 of a magnetic body.

Further still, according to the inverter device, it is possible to use an output relay unit alternatively selected from the first output relay unit 80 and second output relay unit 90 as the output relay unit instead of the output relay bar 73, because of which it is possible to easily carry out a change in the output terminal configuration linking the inverter stack 10 and switchboard 50.

Heretofore, a description has been given of a preferred embodiment of the invention but, the invention not being limited to this, various changes can be carried out.

In the heretofore described embodiment, an output relay unit alternatively selected from the first output relay unit 80 and second output relay unit 90 is used as the output relay unit, but the invention is formed such that an output relay unit having the following kind of attachment member 84 may be used as a modification example of the first output relay unit 80.

Figure 41:
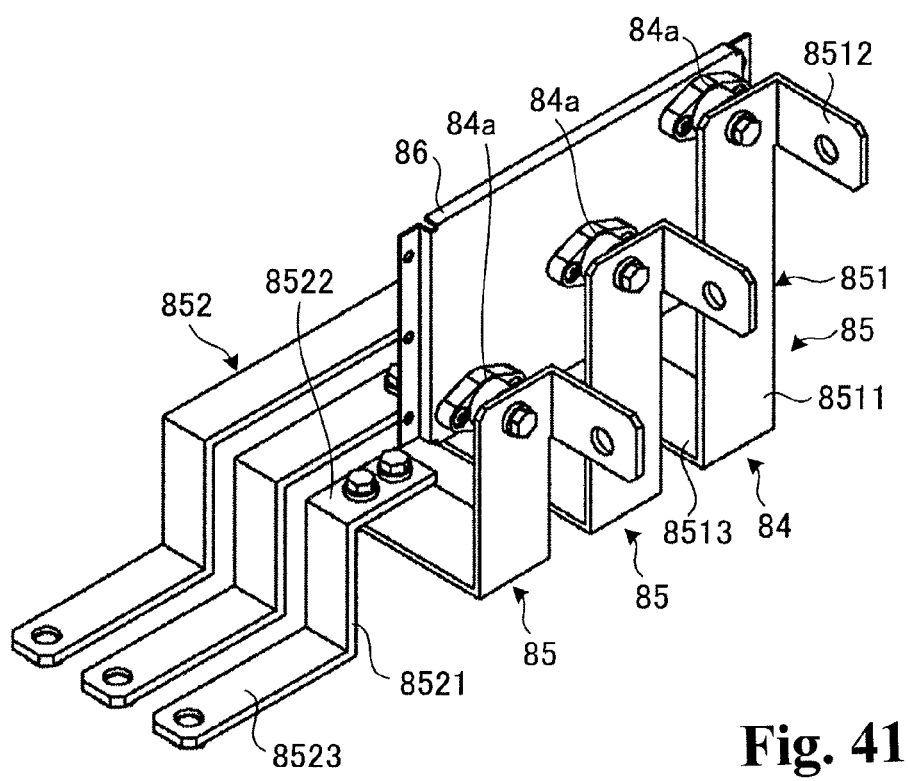
FIG. 41 is a perspective view of an attachment member applicable to the first output relay unit shown in FIG. 31 to FIG. 34 viewed from a front side.
Figure 42:
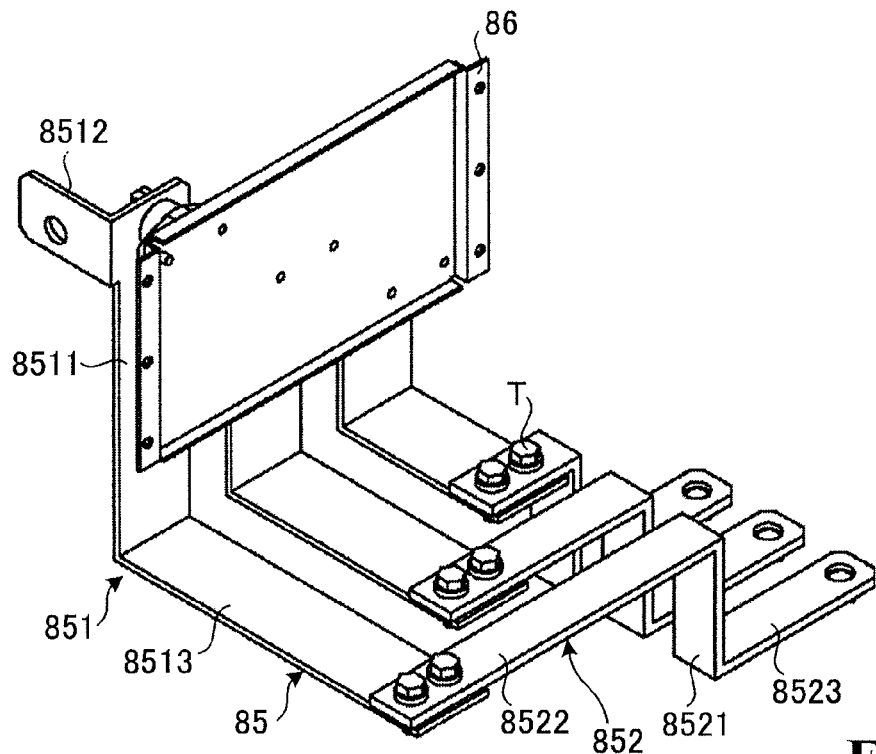
FIG. 42 is a perspective view of the attachment member applicable to the first output relay unit shown in FIG. 31 to FIG. 34 viewed from a rear side.

Each of FIG. 41 and FIG. 42 shows the attachment member 84, which is applicable to the first output relay unit 80 shown in FIG. 31 to FIG. 34, wherein FIG. 41 is a perspective view viewed from the front, while FIG. 42 is a perspective view viewed from the rear. The attachment member 84 illustrated here includes three output relay attachment bars 85.

The three output relay attachment bars 85 include a first output relay attachment bar 851 and second output relay attachment bar 852. The first output relay attachment bar 851 is formed to have a first base portion 8511 extending in a vertical direction, a right extending portion 8512 extending rightward from an upper end portion of the first base portion 8511, and a left extending portion 8513 extending leftward from a lower end portion of the first base portion 8511, wherein the first base portion 8511 is linked to an attachment fixing plate 86 across resin 84a, which is an insulating member.

The second output relay attachment bar 852 is formed to have a second base portion 8521 extending in a vertical direction, a rear extending portion 8522 extending backward from an upper end portion of the second base portion 8521, and a front extending portion 8523 extending forward from a lower end portion of the second base portion 8521, wherein the rear extending portion 8522 is fastened via a fastening member T to the left extending portion 8513 of the first output relay attachment bar 851.

Figure 43:
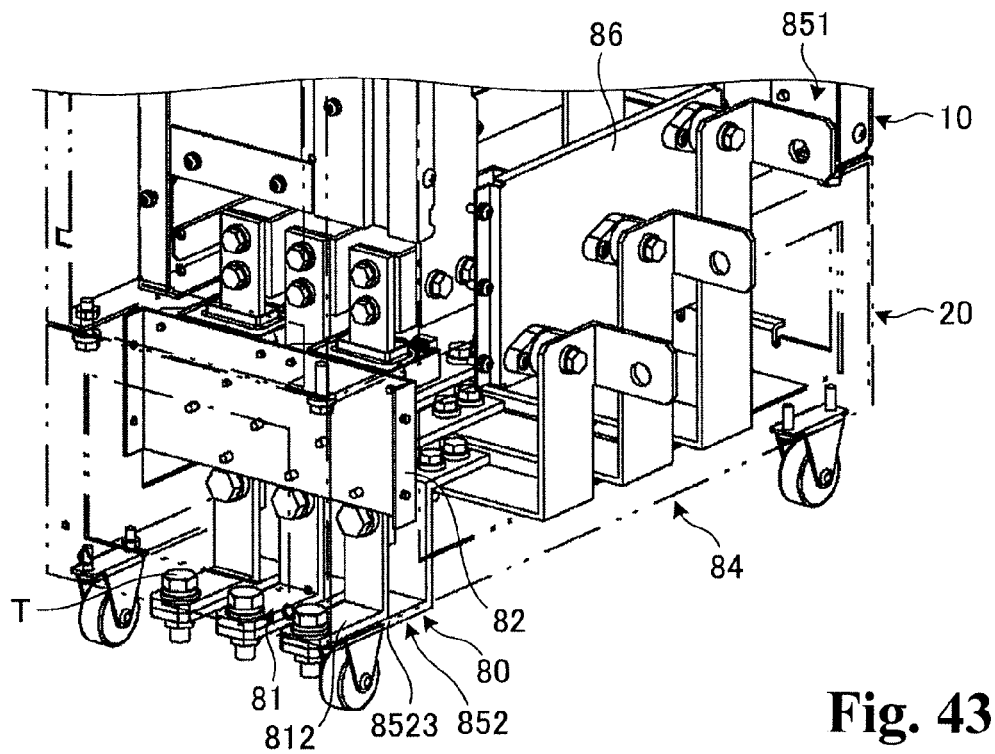
FIG. 43 is an illustration showing a condition in which the attachment member shown in FIG. 41

This kind of attachment member 84 is used by fixing the attachment fixing plate 86 to the lower frame 20 of the inverter stack 10 and fastening the front extending portion 8523 of each second output relay attachment bar 852 to the leading end portion 8122 of the corresponding second output relay bar 812 via a fastening member T, as shown in FIG. 43.

By using the first output relay unit 80 including this kind of attachment member 84 as the output relay unit, it is possible to respond flexibly to customer demands and specification changes.

REFERENCE SIGNS LIST

1 Transport cart
1a Cart caster
2 Base
3 Support surface
3a Protruding portion
4 Rail guide (guide member)
5 Fixing plate (fixing and supporting member)
5a Screw
6 Gripping portion
10 Inverter stack
10a Caster
20 Lower frame
21 Frame member
30 Inverter main body
31 Aperture
32 Rear edge portion
321 Protruding piece
322 Plate spring member
322a Leading end portion
323 Through hole
33 Upper front surface
331 Slot
34 Upper side edge portion
35 Input terminal
40 Fan block
40a Lower surface aperture
41 Engagement hole
411 Attachment hole portion
412 Clamping hole portion
42 Flange
43 Latch hole
44 Rear extending portion
50 Switchboard
51 Mounting surface
52 Entrance portion
53 Output relay terminal
531 Rear surface end portion
532 Front surface end portion
532a Through hole
532b Nut
54 Insulator
55 Output wire
56 Input side terminal
60 Bolt member
60a Body portion
60b Leading end portion
60c Head portion
61 Plate member
611 Through hole
612 Nut
62 Stopper nut
70 Input relay bar
71 Hole portion
72 Cutout
73 Output relay bar
731 First output relay bar
732 Second output relay bar
7321 Base portion
7322 Leading end portion
7321a Insertion hole
7322a Insertion hole
80 First output relay unit
81 Output relay bar
80a Resin
811 First output relay bar
812 Second output relay bar
8121 Base portion
8122 Leading end portion
8122a Insertion hole
82 Fixing plate
84 Attachment member
84a Resin
85 Output relay attachment bar
851 First output relay attachment bar
8511 First base portion
8512 Right extending portion
8513 Left extending portion
852 Second output relay attachment bar
8521 Second base portion
8522 Rear extending portion
8523 Front extending portion
86 Attachment fixing plate
90 Second output relay unit
90a Resin
91 Output relay bar
911 First output relay bar
912 Second output relay bar
9121 Base portion
9122 Leading end portion
9122a Insertion hole
92 Fixing plate
F Fan
T Fastening member

What is claimed is:

1. An inverter device, comprising:
    an inverter stack having
        a lower frame configuring a bottom portion of the inverter stack and including a plurality of frame members connected to each other to form corner portions of a cuboid,
        an output terminal, and
        an output relay bar connected to the output terminal and passing through the lower frame; and
    a switchboard housing the inverter stack,
    wherein the frame members configuring a front side of a four-sided frame are formed of a non-magnetic body, and other frame members are formed of sheet metal.

2. An inverter device according to claim 1, wherein one of the frame members configuring the front side of the frame constructing an upper side of the four-sided frame in the lower frame is formed of the non-magnetic body, and
    one of the frame members configuring the front side of the frame constructing a lower side of the four-sided frame in the lower frame is formed of the non-magnetic body.

3. An inverter device according to claim 1, wherein the lower frame includes a front portion comprising one of the frame members configuring the front side of the frame constructing an upper side of the four-sided frame in the lower frame, one of the frame members configuring the front side of the frame constructing a lower side of the four-sided frame in the lower frame, and longitudinal frame members connecting the one of the frame members in the upper side and one of the frame member in the lower side, and
    the frame members forming the front portion are formed of the non-magnetic body.

4. An inverter device according to claim 1, wherein the output relay bar extends through a space between front, rear, and side frame members from a top side of the lower frame to a bottom side of the lower frame.

5. An inverter device according to claim 4, wherein the switchboard includes
   an input terminal connected to the output terminal of the inverter stack, and
   a housing bottom portion disposed below the input terminal and having an output relay terminal to connect to the output relay bar of the inverter stack.

6. An inverter device according to claim 5, wherein the output relay bar includes
   a first output relay bar extending in a vertical direction of the inverter stack and connected to the output terminal; and
   a second output relay bar having a base portion extending in the vertical direction to connect to the first output relay bar, and a leading end portion extending from the base portion in a direction perpendicular to that of the base portion and connecting to the output relay terminal of the switchboard.

7. An inverter device according to claim 6, wherein the inverter stack further comprises casters on the bottom portion thereof to move in or out from the switchboard, and
   the output relay terminal is disposed at a height lower than that of the casters of the inverter stack.

\* \* \* \* \*

UNITED STATES PATENT AND TRADEMARK OFFICE
CERTIFICATE OF CORRECTION

PATENT NO.        : 9,318,882 B2
APPLICATION NO.   : 14/131780
DATED             : April 19, 2016
INVENTOR(S)       : Toshihiro Yoshida et al.

It is certified that error appears in the above-identified patent and that said Letters Patent is hereby corrected as shown below:

In the specification
Please change column 5, line 46, from "specifically, She ..." to --Specifically, the ...--.

Signed and Sealed this
Twenty-eighth Day of June, 2016

Michelle K. Lee
*Director of the United States Patent and Trademark Office*